(12) United States Patent
Seol et al.

(10) Patent No.: US 12,176,926 B2
(45) Date of Patent: Dec. 24, 2024

(54) ENCODING AND DECODING APPARATUSES AND METHODS FOR IMPLEMENTING MULTI-MODE CODING

(71) Applicant: SAMSUNG ELECTRONICS CO., LTD., Suwon-si (KR)

(72) Inventors: Changkyu Seol, Osan-si (KR); Jiyoup Kim, Hwaseong-si (KR); Hyejeong So, Seoul (KR); Myoungbo Kwak, Seoul (KR); Pilsang Yoon, Hwaseong-si (KR); Sucheol Lee, Hwaseong-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/480,261

(22) Filed: Oct. 3, 2023

(65) Prior Publication Data
US 2024/0030935 A1   Jan. 25, 2024

Related U.S. Application Data

(63) Continuation of application No. 17/689,462, filed on Mar. 8, 2022, now Pat. No. 11,824,563.

(30) Foreign Application Priority Data

| Mar. 10, 2021 | (KR) | .................. 10-2021-0031487 |
| May 7, 2021 | (KR) | .................. 10-2021-0059510 |
| Dec. 7, 2021 | (KR) | .................. 10-2021-0174016 |

(51) Int. Cl.
*H03M 7/14* (2006.01)
*G06F 13/16* (2006.01)
(Continued)

(52) U.S. Cl.
CPC .......... *H03M 7/14* (2013.01); *G06F 13/1673* (2013.01); *G06F 13/4063* (2013.01);
(Continued)

(58) Field of Classification Search
CPC ...................................................... H03M 7/14
See application file for complete search history.

(56) References Cited

U.S. PATENT DOCUMENTS

| 5,731,768 A | * | 3/1998 | Tsang ..................... G06T 9/005 |
| | | | 341/59 |
| 9,768,989 B2 | | 9/2017 | Lincoln et al. |

(Continued)

FOREIGN PATENT DOCUMENTS

| GB | 2267416 | 1/1993 |
| GB | 2267416 A | * 12/1993 ......... G11B 20/1426 |

OTHER PUBLICATIONS

EESR Dated Jul. 21, 2022 In Corresponding EP Patent Application No. 22160754.2.
(Continued)

*Primary Examiner* — Joseph D Torres
(74) *Attorney, Agent, or Firm* — F. Chau & Associates, LLC

(57) ABSTRACT

Encoding and decoding apparatuses and methods for implementing multi-mode coding are provided. The apparatus includes a transmitter and a receiver connected to a data bus. When data bursts are converted by the transmitter into codewords each including a plurality of symbols and/or a codeword received by the receiver is recovered as data bursts, maximum transition avoidance (MTA) codeword mappings in which no maximum transition (MT) event occurs between the plurality of symbols and minimum DC current (MDC) codeword mappings related to minimum power consumption of the plurality of symbols are used.

20 Claims, 25 Drawing Sheets

(51) Int. Cl.
   *G06F 13/40*     (2006.01)
   *H03M 13/00*     (2006.01)
   *H03M 13/29*     (2006.01)
   *H03M 13/45*     (2006.01)

(52) U.S. Cl.
   CPC ...... *H03M 13/2909* (2013.01); *H03M 13/451* (2013.01); *H03M 13/611* (2013.01)

(56) References Cited

U.S. PATENT DOCUMENTS

| | | |
|---|---|---|
| 9,838,017 B2 | 12/2017 | Fox et al. |
| 9,942,063 B2 | 4/2018 | Mendel |
| 10,404,505 B1 | 9/2019 | Wilson |
| 10,491,238 B2 | 11/2019 | Sudhakaran et al. |
| 10,542,186 B2 | 1/2020 | Kim et al. |
| 10,547,387 B2 | 1/2020 | Vegas-Olmos et al. |
| 10,747,695 B2 | 8/2020 | Ho et al. |
| 2002/0009035 A1* | 1/2002 | Tonami ............ G11B 20/10083 |
| 2002/0018422 A1* | 2/2002 | Tonami ............ G11B 20/10009 369/59.22 |
| 2006/0139186 A1 | 6/2006 | Hoyer |
| 2013/0016965 A1* | 1/2013 | Christensen ....... H04B 10/0731 398/25 |
| 2015/0256363 A1 | 9/2015 | Shvydun et al. |
| 2016/0277222 A1 | 9/2016 | Fox et al. |
| 2019/0229749 A1 | 7/2019 | Sudhakaran et al. |
| 2019/0305765 A1 | 10/2019 | Lee et al. |
| 2022/0244863 A1* | 8/2022 | Bhatia .................... G06F 3/0673 |
| 2022/0245025 A1* | 8/2022 | Bhatia .................... G06F 3/0619 |
| 2022/0246184 A1* | 8/2022 | Bhatia .................... H03K 19/21 |
| 2022/0294476 A1 | 9/2022 | Seol et al. |

OTHER PUBLICATIONS

First Office Action Dated Nov. 23, 2022 In Corresponding TW Patent Application No. 111108501.

Office Action dated Jan. 13, 2023 in corresponding U.S. Appl. No. 17/689,462.

Final Office Action dated Apr. 21, 2023 in corresponding U.S. Appl. No. 17/689,462.

* cited by examiner

USER DATA 202

| | d[0:1] | d[2:3] | d[4:5] | d[6:7] | d[8:9] | d[10:11] | d[12:13] | d[14:15] |
|---|---|---|---|---|---|---|---|---|
| DQ[0] | d0[0] | \multicolumn{3}{c}{d0[7:1]} | d0[8] | \multicolumn{3}{c}{d0[15:9]} |
| DQ[1] | d1[0] | d1[7:1] | | | d1[8] | d1[15:9] | | |
| DQ[2] | d2[0] | d2[7:1] | | | d2[8] | d2[15:9] | | |
| DQ[3] | d3[0] | d3[7:1] | | | d3[8] | d3[15:9] | | |
| DQ[4] | d4[0] | d4[7:1] | | | d4[8] | d4[15:9] | | |
| DQ[5] | d5[0] | d5[7:1] | | | d5[8] | d5[15:9] | | |
| DQ[6] | d6[0] | d6[7:1] | | | d6[8] | d6[15:9] | | |
| DQ[7] | d7[0] | d7[7:1] | | | d7[8] | d7[15:9] | | |

BB

ENCODED DATA 204

| | s[0] | s[1] | s[2] | s[3] | s[4] | s[5] | s[6] | s[7] |
|---|---|---|---|---|---|---|---|---|
| DQ[0] | c0[7:0] | | | | c0[15:8] | | | |
| DQ[1] | c1[7:0] | | | | c1[15:8] | | | |
| DQ[2] | c2[7:0] | | | | c2[15:8] | | | |
| DQ[3] | c3[7:0] | | | | c3[15:8] | | | |
| DQ[4] | c4[7:0] | | | | c4[15:8] | | | |
| DQ[5] | c5[7:0] | | | | c5[15:8] | | | |
| DQ[6] | c6[7:0] | | | | c6[15:8] | | | |
| DQ[7] | c7[7:0] | | | | c7[15:8] | | | |
| DBI | d0[0] d1[0] | d2[0] d3[0] | d4[0] d5[0] | d6[0] d7[0] | d0[8] d1[8] | d2[8] d3[8] | d4[8] d5[8] | d6[8] d7[8] |

301

NO LEVEL +3 OF PAM-4 SYMBOL HAVING THE HIGHEST VOLTAGE LEVEL IN CODEWORD

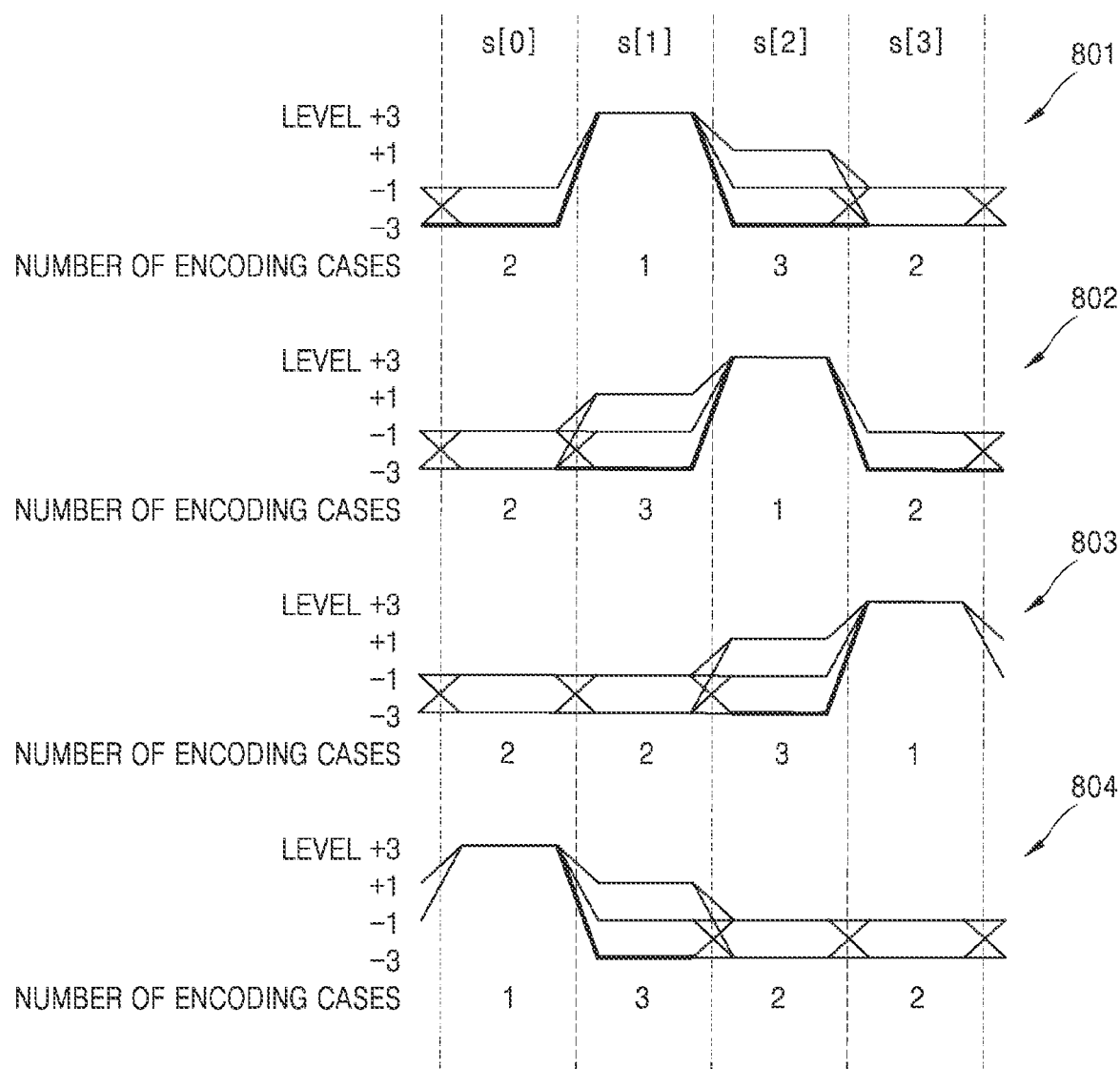

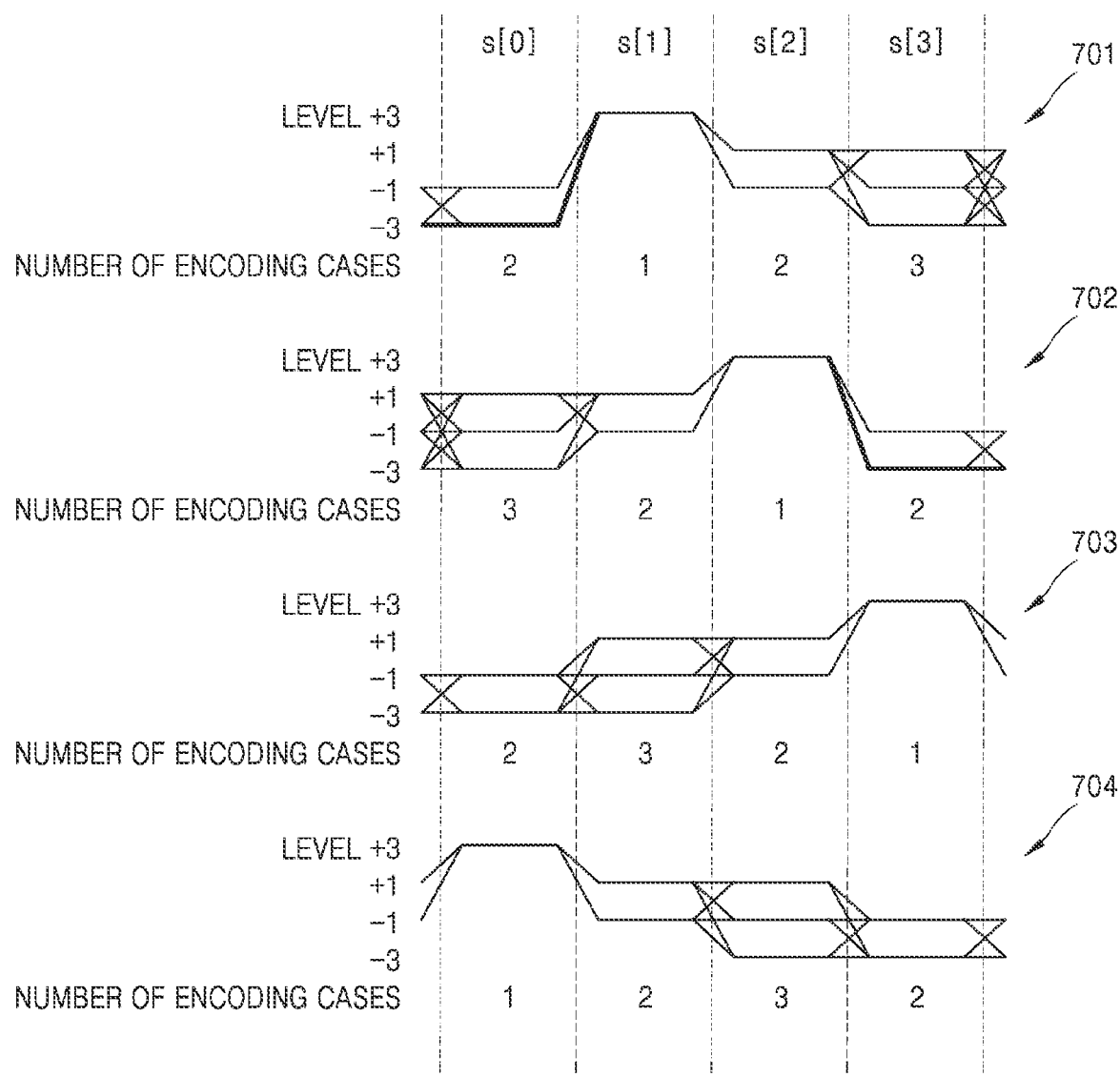

| Symbol Level | −3 | −1 | +1 | +3 |
|---|---|---|---|---|
| Tx/Rx Config. | R1=∞, Z₀=R, 130, R2=R, R3=R | R1=3R, Z₀=R, 130, R2=1.5R, R3=R | R1=1.5R, Z₀=R, 130, R2=3R, R3=R | R1=R, Z₀=R, 130, R2=∞, R3=R |
| DC Current | 0 | 5VDD/18 | 8VDD/18 | 9VDD/18 |
| DC Cost | 0 | 5 | 8 | 9 |

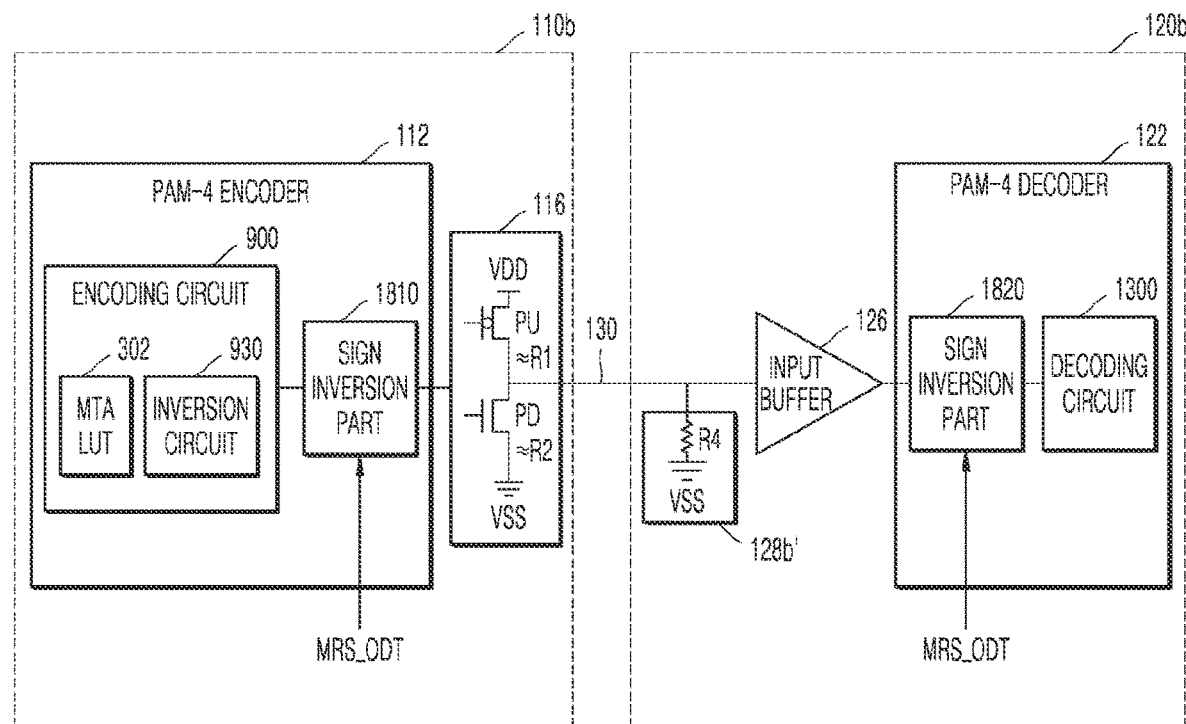
FIG. 18B
FIG. 19A
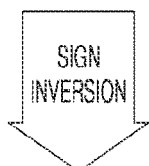

| Symbol Level | -3 | -1 | +1 | +3 |
|---|---|---|---|---|
| Tx/Rx Config. | R1=∞, R4=R, Z₀=R, 130, R2=R | R1=3R, R4=R, Z₀=R, 130, R2=1.5R | R1=1.5R, R4=R, Z₀=R, 130, R2=3R | R1=R, R4=R, Z₀=R, 130, R2=∞ |
| DC Current | 9VDD/18 | 8VDD/18 | 5VDD/18 | 0 |
| DC Cost | 9 | 8 | 5 | 0 |

ENCODING AND DECODING APPARATUSES AND METHODS FOR IMPLEMENTING MULTI-MODE CODING

CROSS-REFERENCE TO RELATED APPLICATIONS

This U.S. non-provisional patent application is a continuation of U.S. patent application Ser. No. 17/689,462 filed Mar. 8, 2022, which claims priority under 35 U.S.C. § 119 to Korean Patent Application Nos. 10-2021-0031487, 10-2021-0059510, and 10-2021-0174016, filed on Mar. 10, 2021, May 7, 2021, and Dec. 7, 2021, in the Korean Intellectual Property Office, the disclosures of which are incorporated by reference in their entirety herein.

1. TECHNICAL FIELD

The inventive concept relates to encoding and decoding for implementing multi-mode coding to support maximum transition avoidance and/or minimum power consumption.

2. DISCUSSION OF RELATED ART

Ethernet is a family of computer networking technologies that is most widely used in local area network (LAN), metropolitan area networks (MAN) and wide area networks (WAN). Data sent across Ethernet may be encoded using schemes such as Non-Return-to-Zero (NRZ) signaling and Pulse-Amplitude Modulation 4-Level (PAM-4) signaling. NRZ signaling is a modulation technique that has two voltage levels to represent logic 0 and logic 1. PAM-4 signaling uses four voltage levels to represent four different two-bit logical levels (e.g., 11, 10, 01, 00).

PAM-4 signaling has become more viable since NRZ signaling has a higher Nyquist frequency, which results in a higher channel-dependent loss. PAM-4 signaling may be used to convert a 2-bit stream into a single multi-level signal having 4 levels. A PAM-4 signaling system may use maximum transition avoidance (MTA) coding to handle a maximum voltage transition between PAM-4 symbols. MTA coding may reduce inter-symbol interference (ISI) and crosstalk that causes signal distortion.

SUMMARY

At least one embodiment the inventive concept provides encoding and decoding apparatuses and methods for implementing multi-mode coding to support maximum transition avoidance and/or minimum power consumption selectively or in combination.

According to an embodiment of the inventive concept, there is provided an apparatus including a transmitter connected to a data bus. The transmitter includes an encoder configured to convert data bursts to be transmitted through a data bus into codewords each including a plurality of symbols. The encoder is configured to encode the data bursts into a codeword corresponding to the data bursts using maximum transition avoidance (MTA) codeword mappings in which no maximum transition (MT) event occurs between the plurality of symbols and minimum DC current (MDC) codeword mappings related to minimum power consumption of the plurality of symbols.

According to an embodiment of the inventive concept, there is provided an apparatus including a transmitter connected to a data bus. The transmitter includes an encoder configured to convert data bursts to be transmitted through the data bus into codewords including a plurality of symbols. The encoder includes a logic circuit and an encoder circuit. The logic circuit represents correlations between the data bursts and the codewords. The logic circuit includes codeword mappings related to operation requirements of the encoder. The operation requirements of the encoder include a maximum transition avoidance (MTA) requirement between the plurality of symbols and a minimum DC current (MDC) requirement related to minimum power consumption of the plurality of symbols. The encoding circuit is configured to provide the codeword corresponding to the data bursts to the data bus using the logic circuit.

According to an embodiment of the inventive concept, there is provided an encoding method of converting data into codewords including setting a weighting value indicating operation requirements of an encoding, wherein the operation requirements include a maximum transition avoidance (MTA) requirement between the plurality of symbols and a minimum DC current (MDC) requirement related to minimum power consumption of the plurality of symbols; calculating an encoding cost value with respect to each of 2n codewords including n-bits using the weighting value, wherein the codewords include the plurality of symbols, and the encoding cost value is calculated based on an average value of MT events between the plurality of symbols and an average power cost value of the plurality of symbols with respect to all the $2^n$ codewords, a number of MT events of each of the $2^n$ codewords, a sum of power cost values and the weighting value; selecting $2^{n-p}$ codewords having a low encoding cost value from among the $2^n$ codewords; and mapping the selected $2^{n-p}$ codewords to the data. The data is n-p bits, n and p are natural numbers and n is greater than p.

According to an embodiment of the inventive concept, there is provided a method of transmitting data including receiving data bursts of 16-bits to be transmitted through a data line; splitting the data bursts into two half-data bursts; sending a 1-bit value of each of the two half-data bursts to a data bus inversion (DBI) signal line to encode a pair of 1-bit values into a symbol of the DBI signal line; performing 7:8-bit encoding on remaining 7-bits of each of the two half-data bursts to generate codewords including four symbols having at least four levels; determining whether a maximum transition (MT) event occurs between a last symbol of a previous codeword provided through the data bus and a first symbol of a current codeword in a block boundary between the codewords with respect to the half-data bursts; when it is determined that the MT event occurs, inverting the current codeword and transmitting the inverted codeword through the data line; and when it is determined that no MT event occurs, transmitting the current codeword through the data line.

According to an embodiment of the inventive concept, there is provided an apparatus including a receiver connected to a data bus. The receiver includes a decoder configured to receive codewords including a plurality of symbols through the data bus, and recover data bursts from the received codewords. The decoder is configured to decode the codewords into the data bursts corresponding to the codewords using maximum transition avoidance (MTA) codeword mappings in which no maximum transition (MT) event occurs between the plurality of symbols and minimum DC current (MDC) codeword mappings related to minimum power consumption of the plurality of symbols.

According to an embodiment of the inventive concept, there is provided an apparatus including a receiver connected to a data bus. The receiver includes a decoder configured to receive codewords including a plurality of symbols through the data bus, and recover data bursts from the received codewords. The decoder includes a logic circuit and a decoding circuit. The logic circuit represents correlations between the codewords and the data bursts. The logic circuit includes codeword mappings related to operation requirements of the decoder. The operation requirements of the decoder include a maximum transition avoidance (MTA) requirement between the plurality of symbols and a minimum DC current (MDC) requirement related to minimum power consumption of the plurality of symbols. The decoding circuit is configured to determine whether a current codeword among the codewords received by the decoder is an inverted codeword, and recover a data burst from the current codeword using lookup tables.

According to an embodiment of the inventive concept, there is provided a method of receiving data including receiving, through a data line, codewords of 8-bits including four symbols having at least four levels; determining whether a current codeword among the codewords received through the data line is an inverted codeword; when it is determined that the current codeword is the inverted codeword, inverting the current codeword and outputting the inverted codeword as a first codeword; when it is determined that the current codeword is not the inverted codeword, outputting the current codeword as the first codeword; converting 8-bits of the first codeword into data bursts of 7-bits by performing 8:7-bit decoding on 8-bits of the first codeword; and combining the 7-bits converted by the 8:7-bit decoding with a 1-bit value of a symbol received through a data bus inversion (DBI) signal line to recover data bursts of 8-bits.

BRIEF DESCRIPTION OF THE DRAWINGS

Embodiments of the inventive concept will be more clearly understood from the following detailed description taken in conjunction with the accompanying drawings in which:

FIG. 2 is a diagram illustrating 7-8 bit encoding used in a pulse-amplitude modulation (PAM)-4 encoder according to an embodiment of the inventive concept;

FIGS. 6A and 6B are diagrams illustrating codeword encoding of a low minimum current (MDC) lookup table of FIG. 3;

FIGS. 9A and 9B are diagrams illustrating codeword encoding of a second intermediate lookup table of FIG. 7;

FIG. 17 is a diagram illustrating symbols of a codeword applied to a ground voltage ODT target between the transmitter and the receiver of FIG. 16A;

FIGS. 18A and 18B are diagrams conceptually illustrating an asymmetric ODT circuit in relation to a transmitter and a receiver according to an embodiment of the inventive concept;

FIG. 19A is a diagram illustrating an operation of a sign inversion part of FIG. 18;

DETAILED DESCRIPTION OF THE EMBODIMENTS

Figure 1:
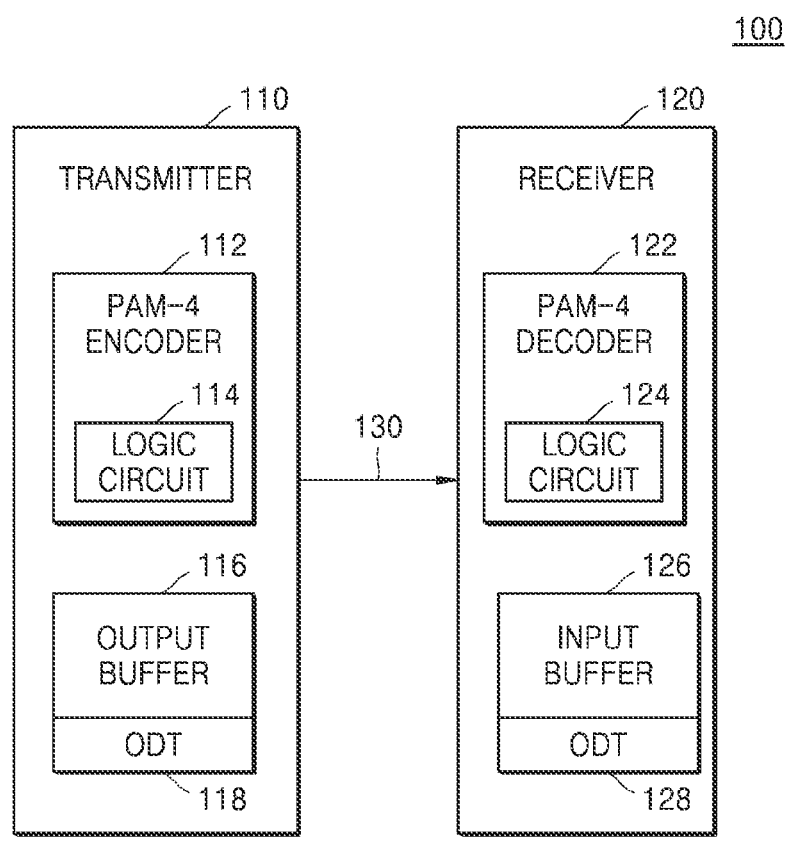
FIG. 1 is a block diagram illustrating an apparatus including a transmitter and a receiver according to an example embodiment of the inventive concept.

FIG. 1 is a block diagram illustrating an apparatus 100 including a transmitter 110 and a receiver 120 according to an example embodiment of the inventive concept.

Referring to FIG. 1, the apparatus 100 may refer to an integrated circuit, an electronic device or system, a smart phone, a tablet personal computer (PC), a computer, a server, a workstation, a portable communication terminal, a personal digital assistant (PDA), a portable multimedia player (PMP), a computing device such as other suitable computers, a virtual machine or a virtual computing device thereof, etc. Alternatively, the apparatus 100 may be one of a plurality of components included in a computing system such as a graphics card.

The transmitter 110 may communicate with the receiver 120 through a channel 130. The channel 130 may include a plurality of signal lines that physically or electrically connect the transmitter 110 to the receiver 120. The transmitter 110, the receiver 120, and the channel 130 may support pulse-amplitude modulation 4-level (PAM-4) signaling that converts 2 bit data streams into a single multi-level signal having 4 levels.

The transmitter 110 may include a PAM-4 encoder 112 that converts data bursts to be transmitted to the receiver 120 into PAM-4 symbols. The PAM-4 encoder 112 may perform encoding on the data bursts to generate PAM-4 symbols. The transmitter 110 may further include an output buffer 116 and a termination circuit 118 for driving the PAM-4 symbols to the channel 130. The transmitter 110 may transmit the PAM-4 symbols to the receiver 120 through the channel 130.

The PAM-4 encoder 112 may include a logic circuit 114 including multiple lookup tables 905 (see FIG. 11) configured to implement multi-mode coding. The lookup tables may be implemented as registers (or storage elements) that store correlations between the data bursts and the PAM-4 symbols. The PAM-4 encoder 112 may convert the data bursts into the PAM-4 symbols using the lookup tables.

The PAM-4 symbols may be transmitted from the output buffer 116 to the channel 130. The termination circuit 118 may adjust a termination resistance value to provide impedance matching with respect to the channel 130. When an output impedance of the transmitter 110 and an impedance of a receiving end do not match, signal reflection is induced at the receiving end and the reflected signal is not transmitted properly, so that a voltage level at the receiving end is changed, and signal transmission may not be performed properly. By suppressing signal reflection by impedance matching of the channel 130, signal integrity of transmitted and received signals may be improved.

According to an embodiment, a calibration command may instruct the termination circuit 118 to calibrate the impedance. For example, the transmitter 110 may send the calibration command to the termination circuit 118. According to an embodiment, the termination circuit 118 may be an on-die-termination (ODT) circuit that provides a termination resistance to the channel 130 based on a ZQ calibration code generated in a calibration operation related to an impedance adjustment pin (e.g., a ZQ pin) connected to an external resistance. In FIG. 1, the termination circuit 118 is shown as being independent of the output buffer 116, but an ODT operation may be performed by at least a part of the output buffer 116. Accordingly, the output buffer 116 and the termination circuit 118 may be coupled to adjust a swing width and/or driving strength of signals transmitted to the channel 130 and provide a termination resistance to the channel 130.

The receiver 120 may include a PAM-4 decoder 122 that receives the PAM-4 symbols and decodes the received PAM-4 symbols. The PAM-4 decoder 122 may decode the PAM-4 symbols to recover data bursts of 2-bit streams. The receiver 120 may further include an input buffer 126 and a termination circuit 128 receiving the PAM-4 symbols on the channel 130. The receiver 120 may receive the PAM-4 symbols through the channel 130 and reconstruct the PAM-4 symbols into data bursts.

The PAM-4 decoder 122 may include a logic circuit 124 including multiple lookup tables 1305 (see FIG. 13) configured to decode the PAM-4 symbols to recover data bursts of 2-bit streams. The lookup tables show the correlation between the PAM-4 symbols and the data bursts. The PAM-4 decoder 122 may recover the PAM-4 symbols into the data bursts using the lookup tables. The lookup tables of the PAM-4 decoder 122 may be configured the same as the lookup tables of the PAM-4 encoder 112.

The input buffer 126 may receive PAM-4 symbols through the channel 130. The termination circuit 128 may provide a termination resistance with respect to the channel 130. According to an embodiment, the termination circuit 128 may be an on-die-termination (ODT) circuit. According to an embodiment, the input buffer 126 may receive a signal transmitted to the channel 130 based on a reference voltage.

FIG. 2 is a diagram illustrating 7-8 bit encoding 200 used in the PAM-4 encoder 112 of FIG. 1.

Referring to FIG. 2, the 7-8 bit encoding 200 of user data 202 to generate encoded data 204 is shown. The user data 202 may be referred to as raw data. With respect to the user data 202 and the encoded data 204, each row DQ[i] represents a serial data line.

In the user data 202, 16-bit data bursts are configured on each DQ[i] serial data line, and columns are configured as sequential 2-bit positions within the 16-bit data bursts. For example, second and third bits of each data burst are denoted by a column labeled d[2:3]. Each 16-bit data burst is denoted by two half-data bursts of 8 bits. For example, on the serial data line DQ[0], the 16-bit data burst splits into a first half-data burst d0[0]d0[7:1] and a second half-data burst d0[8]d0[15:9]. Each half-data burst further splits into 1-bit: 7-bit pairs. For example, on the serial data line DQ[0], the first half-data burst d0[0]d0[7:1] splits into a 1-bit value of d0[0] and a 7-bit value of d0[7:1].

In the encoded data 204, DQ[i] rows represent serial data lines, a data bus inversion (DBI) row represents a DBI signal line, and columns represent bit columns representing symbols (s[i]). For example, s[0] represents a first 2-bit PAM4 symbol on each serial data line, and s[1] represents a second 2-bit PAM4 symbol.

The 7-8 bit encoding 200 may encode a pair of 1-bit data values of other serial data lines as PAM-4 symbols on the DBI signal line. For example, data d0[0] of the serial data line DQ[0] and data d1[0] of a serial data line DQ[1] are encoded as 2-bit PAM-4 symbols on the DBI signal line. Similarly, data d2[0] of a serial data line DQ[2] and data d3[0] of a serial data line DQ[3] are encoded as 2-bit PAM-4 symbols on the DBI signal line.

According to an embodiment, in the 7-8 bit encoding 200, the 2-bit PAM-4 symbol on the DBI signal line may encode a pair of 1-bit data values of any bit position of one serial data line as PAM-4 symbols on the DBI signal line. For example, data d0[0] and d0[8] on the serial data line DQ[0] may be encoded as the 2-bit PAM-4 symbols on the DBI signal line, and data d1[0] and d1[8] on the serial data line DQ[1] may be encoded as the 2-bit PAM-4 symbols on the DBI signal line.

In the 7-8 bit encoding 200, the remaining 7 bits that are not used as the PAM-4 symbols of the DBI signal line of each half-data burst are encoded as four PAM-4 symbols on the corresponding serial data line. The four PAM-4 symbols include 8 bits and may be referred to as a codeword. For example, data d0[7:1] is encoded as a codeword c0[7:0] on the serial data line DQ[0]. A codeword with respect to 7 bits of each of the data d0[7:1] may be denoted by four PAM-4 symbols. The data d0[7:1] is encoded as a codeword c0[7:0] including symbols s[0], s[1], s[2] and s[3].

In the 7-8 bit encoding 200, between a codeword ci[7:0] with respect to 7 bits of the first half-data burst and a codeword ci[15:8] with respect to 7 bits of the second half-data burst on each DQ[i] serial data line may be referred to as a block boundary (BB). A codeword inversion scheme (FIGS. 12A and 12B) may be applied to the boundary block BB to prevent a maximum transition (MT) event between a last symbol of a current codeword and a first symbol of a next codeword.

Mapping of 7-bit data values to codewords may be performed in various ways according to encoding operation requirements and stored as lookup tables (see FIGS. 3A and 3B). The encoding operation requirements may include MTA between PAM-4 symbols, minimum DC current (MDC) related to minimum power consumption of the transmitter 110 (FIG. 1), or a combination of MTA and MDC, etc. The lookup tables may be configured to select 128 patterns required for 7-bit encoding of user data from among 256 patterns according to 8-bit encoding of four PAM-4 symbols s[0], s[1], s[2] and s[3] and provide codewords of the selected 128 patterns.

Hereinafter, mapping between PAM-4 symbols and symbol bits configured to support MTA and/or MDC requirements will be described based on Table 1 below. Table 1 is a non-limiting example for illustrative purpose.

TABLE 1

| PAM-4 Symbol Levels | −3 | −1 | +1 | +3 |
|---|---|---|---|---|
| symbol bits | 00 | 01 | 11 | 10 |
| current level | 0 | 5VDD/18 | 8VDD/18 | 9VDD/18 |
| DC power cost | 0 | 5 | 8 | 9 |

Referring to Table 1, the 2-bit PAM-4 symbol may be transmitted on the channel 130 (see FIG. 1) at four symbol levels denoted as level −3, −1, +1 or +3 (or a −3 level, a −1 level, a +1 level, or a +3 level). Each of the four symbol levels may have four current levels by the output buffer 116 (FIG. 1). For example, the PAM-4 symbol of level +3 (or a +3 level) is represented by symbol bit 10 and may be set to have the highest current level, e.g., 9VDD/18 current level. The PAM-4 symbol of level +1 (or a +1 level) is represented by symbol bit 11 and may be set to have an 8VDD/18 current level. The PAM-4 symbol of level −1 (or a −1 level) is represented by symbol bit 01 and may be set to have a 5VDD/18 current level. The PAM-4 symbol of level −3 (or a −3 level) is represented by symbol bit 00 and may be set to have the lowest zero (0) current level. Accordingly, the PAM-4 symbol of level +3 may be represented as having the highest DC power cost value of 9, the PAM-4 symbol of level +1 may be represented as having a DC power cost value of 8, the PAM-4 symbol of level −1 may be represented as having a DC power cost value of and the PAM-4 symbol of level −3 may be represented as having the lowest DC power cost value of 0.

Figures 3, 4A:
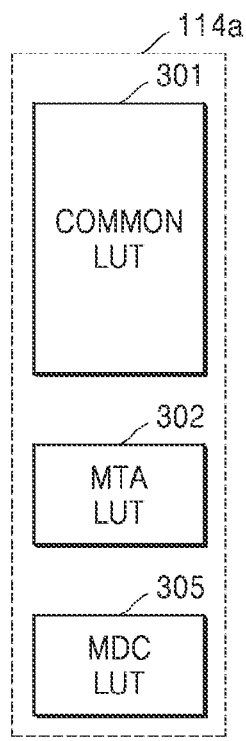
FIG. 3 is a diagram illustrating an example of a logic circuit of a PAM-4 encoder of FIG. 1.
FIGS. 4A and 4B are diagrams illustrating codeword encoding of a common lookup table of FIG. 3.
Figure 4B:
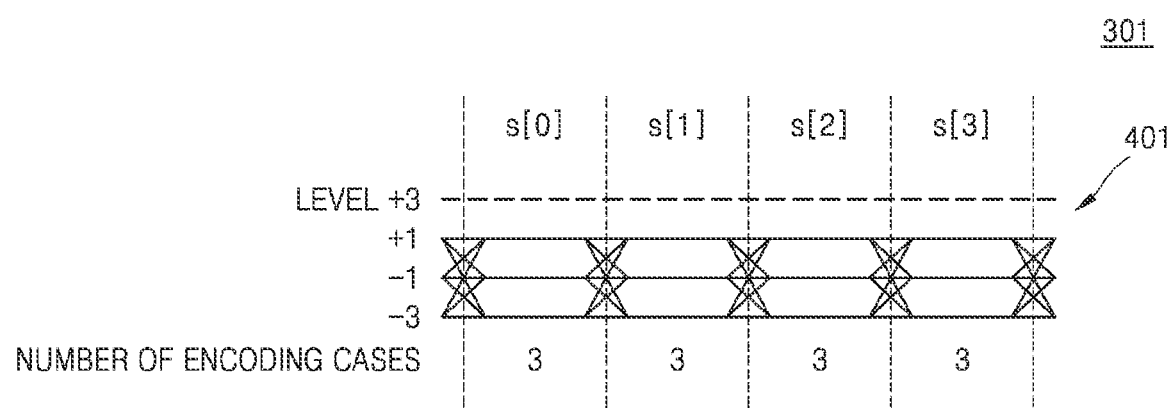
Figure 5A:
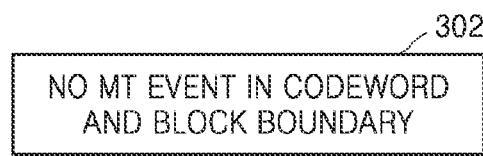
FIGS. 5A and 5B are diagrams illustrating codeword encoding of a maximum transition avoidance (MTA) lookup table of FIG. 3.
Figure 5B:
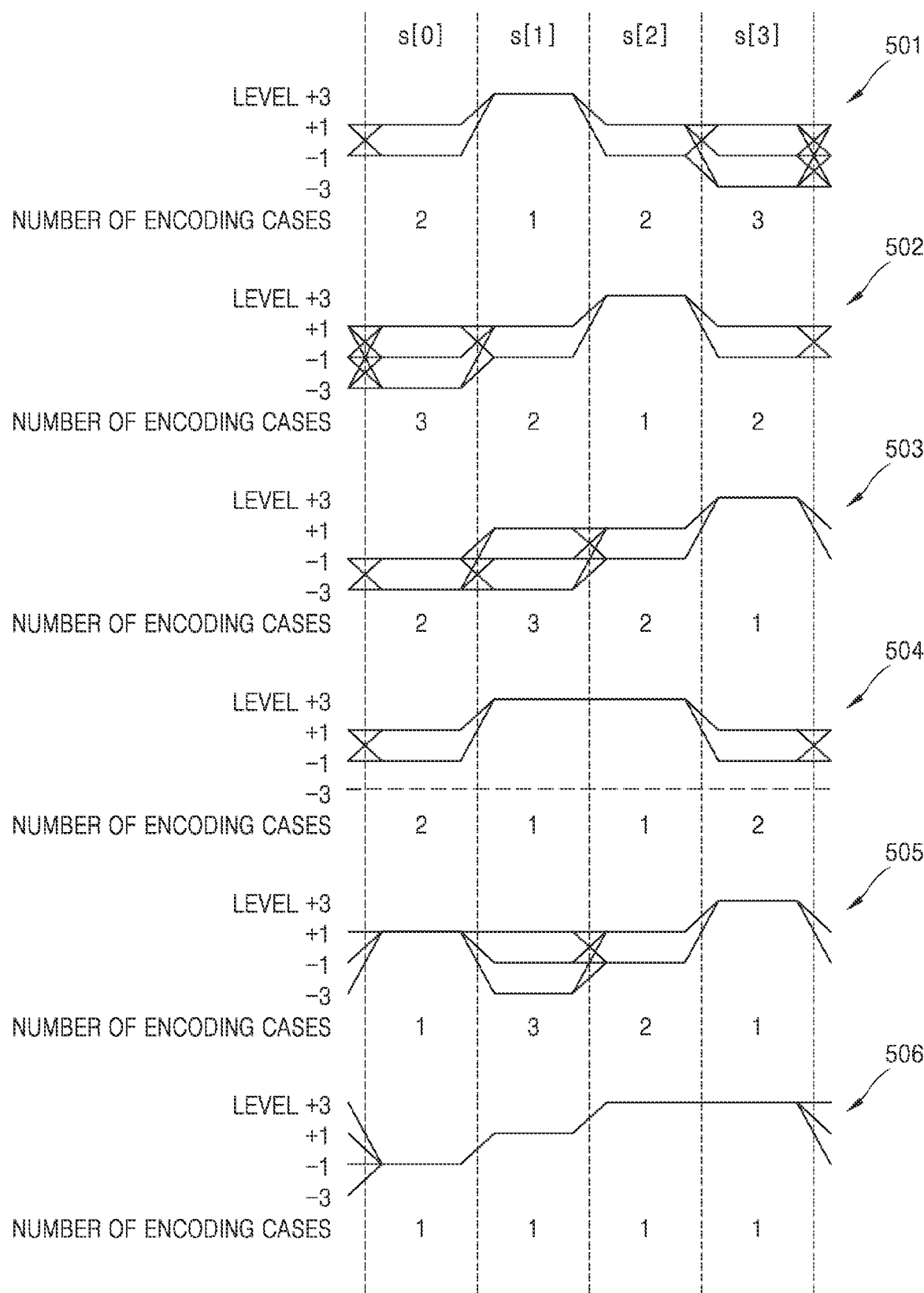
Figure 6A:

FIG. 3 is a diagram illustrating an example of a logic circuit 114a of the PAM-4 encoder 112 of FIG. 1. The logic circuit 114a of FIG. 3 may be used to implement the logic circuit 114 of FIG. 1. FIGS. 4A and 4B are diagrams illustrating codeword encoding of a common lookup table 301 of FIG. 3. FIGS. 5A and 5B are diagrams illustrating codeword encoding of an MTA lookup table 302 of FIG. 3. FIGS. 6A and 6B are diagrams illustrating codeword encoding of an MDC lookup table 305 of FIG. 3. Hereinafter, subscripts (e.g., a in 114a and b in 114b) attached to the reference numerals are used to distinguish a plurality of circuits having the same function.

Referring to FIG. 3, the logic circuit 114a of the PAM-4 encoder 112 may include the common lookup table 301, the MTA lookup table 302, and the MDC lookup table 305. The common lookup table 301 may include codeword mappings that support both an MTA requirement and an MDC requirement. The MTA lookup table 302 may include codeword mappings that support the MTA requirement. The MDC lookup table 305 may include codeword mappings that support the MDC requirement.

In order to satisfy both the MTA requirement and the MDC requirement, as shown in FIG. 4A, in the common lookup table 301, no PAM-4 symbol of level +3 having the highest voltage level needs to be present in a codeword. The common lookup table 301 may include codewords (3*3*3*3=81) according to symbol encoding 401 of level −3, −1 or +1 in the symbols s[0], s[1], s[2], and s[3] of each codeword, as shown in FIG. 4B. Accordingly, the common lookup table 301 may include 81 codewords.

Because the common lookup table 301 includes the 81 codewords, in order to provide 128 codewords for the 7-8 bit encoding 200, each of the MTA lookup table 302 and MDC lookup table 305 may be implemented to include 47 codewords. The PAM-4 encoder 112 may select one of the MTA lookup table 302 and the MDC lookup table 305, and perform the 7-8 bit encoding 200 using 128 codewords which is the sum of the 47 codewords of the selected lookup table and the 81 codewords of the common lookup table 301.

The MTA lookup table 302 may include codeword mappings that support an entire MTA requirement. The MTA lookup table 302 may be provided to satisfy the entire MTA requirement that no MT event occurs from level −3 to level +3 or from level +3 to level −3 between symbols in each codeword, and no MT event occurs even in a boundary block BB, as shown in FIG. 5A. That is, the MTA lookup table 302 may be provided to satisfy the MTA requirement both between symbols in each codeword and even in the boundary block BB. The MTA lookup table 302 may include codewords according to multiple symbol encodings 501 to 506 in the symbols s[0], s[1], s[2], and s[3] of each codeword, as shown in FIG. 5B. The symbol encodings 501 to 506 may be performed to include at least one symbol of level 3 in a codeword and to satisfy the MTA requirement between symbols and in the boundary block BB.

For example, the symbol encodings 501 to 503 may provide codewords in which the first symbol s[0] is not level +3 and includes at least one symbol of level −3. The symbol encoding 501 may provide twelve codewords (2*1*2*3=12) configured such that there is no MT event between symbols when the second symbol s[1] is level +3. The symbol encoding 502 may provide codewords 12 (3*2*1*2=12) configured such that there is no MT event between symbols when the third symbol s[2] is level +3. The symbol encoding 503 may provide twelve codewords (2*3*2*1=12) configured such that there is no MT event between symbols when the fourth symbol s[3] is level +3. The symbol encodings 504 to 506 may provide codewords in which the first symbol s[0] is not level −3 and level +3 and includes at least one symbol of level +3. The symbol encoding 504 may provide four codewords (2*1*1*2=4) configured such that there is no MT event between symbols when the first symbol s[0] is level +1 or level −1. The symbol encoding 505 may provide six codewords (1*3*2*1=6) configured such that there is no MT event between symbols when the first symbol s[0] is level +1. In addition, the symbol encoding 506 may provide one codeword (1*1*1*1=1) configured such that there is no MT event between symbols when the first symbol s[0] is level −1. Accordingly, the MTA lookup table 302 may include forty-seven codewords (12+12+12+4+6+1=47) according to the symbol encodings 501 to 506.

According to an embodiment, the MTA lookup table 302 may be configured to adaptively provide corresponding codewords according to an ODT state of a ground voltage VSS or a supply voltage VDD between a transmitter 110a and a receiver 110b which will be described with reference to FIGS. 16A and 16B. For example, the MTA lookup table 302 may include a first table including codewords including several symbols of level −3 corresponding to an ODT target of the ground voltage VSS and a second table including codewords including several symbols of level +3 corresponding to an ODT target of the supply voltage VDD.

The MDC lookup table 305 may include codeword mappings that maximally support the MDC requirement. The MDC lookup table 305 may be provided to maximally satisfy the MDC requirement by allowing the MT event between symbols up to a maximum of two times in each codeword, as shown in FIG. 6A. The MDC lookup table 305 may provide at least two codewords including level −3 having the lowest DC power cost as the MT event is allowed up to a maximum of two times. Accordingly, the MDC lookup table 305 may satisfy the MDC requirement to a relatively maximum extent.

The MDC lookup table 305 may include codewords according to multiple symbol encodings 801 to 804 in the symbols s[0], s[1], s[2], and s[3] of each codeword, as shown in FIG. 6B. The symbol encodings 801 to 804 may include at least one symbol of level +3 by including at least two symbols of level −3 in a codeword and allowing the MT event between symbols up to a maximum of two times. Accordingly, the MT event between symbols may be present two times or one time in the codewords according to the symbol encodings 801 to 804.

For example, symbol encoding 801 may provide twelve codewords (2*1*3*2=12) configured such that the MT event is present two times between the first symbol s[0] and the second symbol s[1] and between the second symbol s[1] and the third symbol s[2], i.e., before and after the second symbol s[1], when the second symbol s[1] is level +3. The symbol encoding 802 may provide twelve codewords (2*3*1*2=12) configured such that the MT event is allowed two times before and after the third symbol s[2] when the third symbol s[2] is level +3. The symbol encoding 803 may provide twelve codewords (2*2*3*1=12) configured such that the MT event is present one time between the third symbol s[2] and the fourth symbol s[3] when the fourth symbol s[3] is level +3. The symbol encoding 804 may provide twelve codewords (1*3*2*2=12) configured such that the MT event is present one time between the first symbol s[0] and the second symbol s[1] when the first symbol s[0] is level +3. The symbol encoding 804 may provide codewords (12−1=11) obtained by subtracting any one of 12 codewords, e.g., a codeword in which the symbols s[0], s[1], s[2] and s[3] are {3, 2, 2, 1}. Accordingly, the MDC lookup table 305 may include forty-seven codewords (12+12+12+11=47) according to the symbol encodings 801 to 804.

Figure 7:
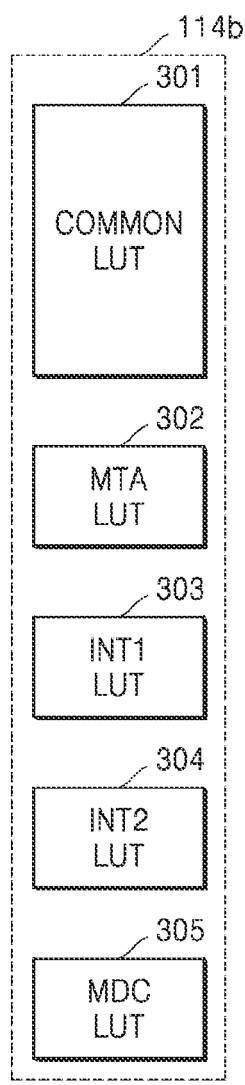
FIG. 7 is a diagram of another example illustrating a logic circuit of the PAM-4 encoder of FIG. 1.
Figure 8A:
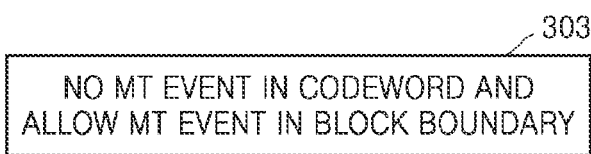
FIGS. 8A and 8B are diagrams illustrating codeword encoding of a first intermediate lookup table of FIG. 7.
Figure 8B:
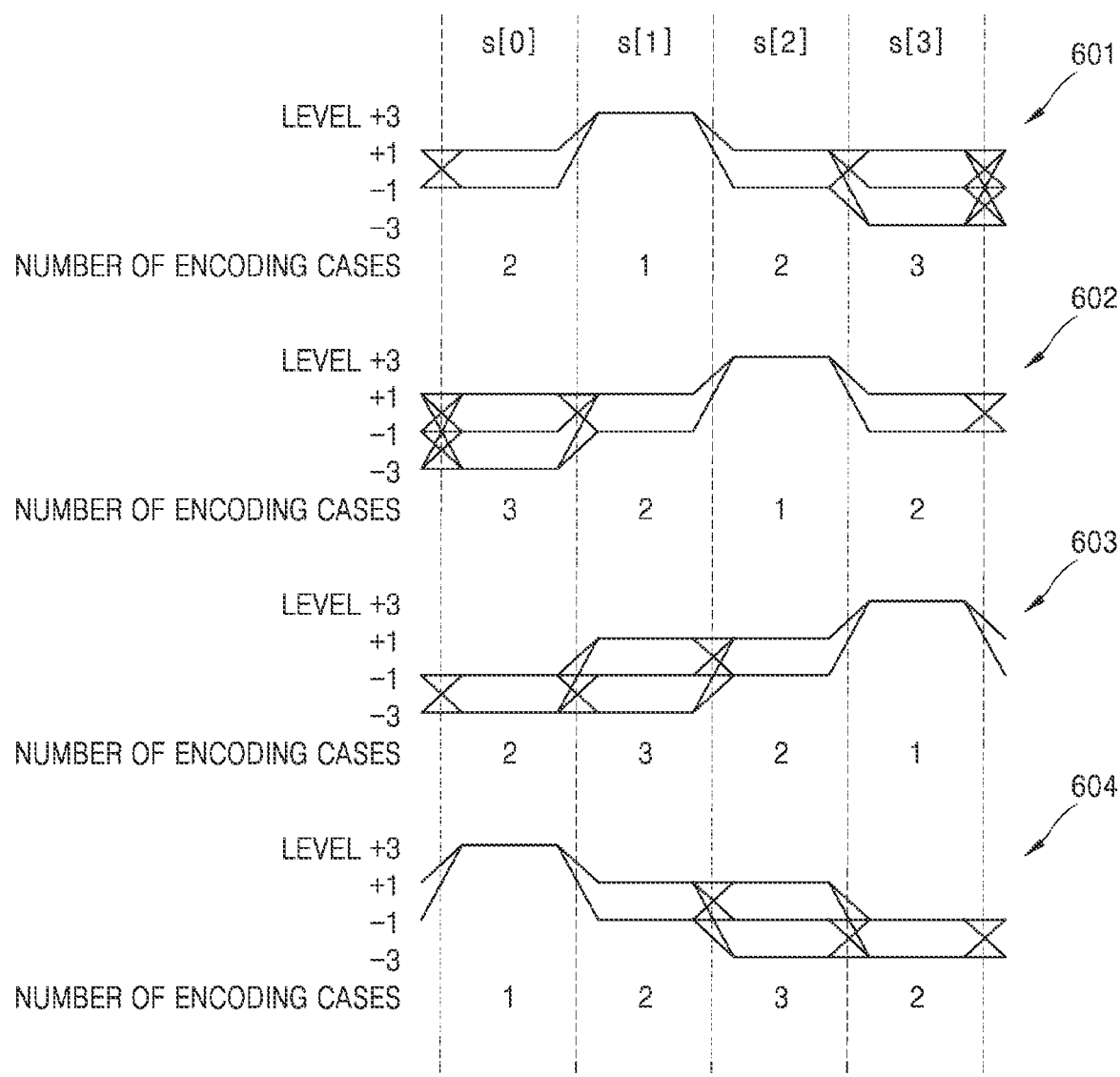
Figure 9A:
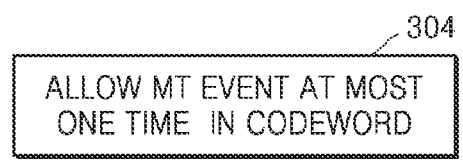

FIG. 7 is a diagram of another example illustrating a logic circuit 114b of the PAM-4 encoder 112 of FIG. 1. For example, the logic circuit 114 of FIG. 7 may be used to implement the logic circuit 114b of FIG. 1. FIG. 7 shows that the logic circuit 114b further includes a first intermediate lookup table 303 and a second intermediate lookup table 304 in addition to the common lookup table 301, the MTA lookup table 302, and the MDC lookup table 305 described with reference to FIG. 1. The first intermediate lookup table 303 and the second intermediate lookup table 304 may be provided according to combinations of an MTA requirement and an MDC requirement. FIGS. 8A and 8B are diagrams illustrating codeword encoding of the first intermediate lookup table 303 of FIG. 7. FIGS. 9A and 9B are diagrams illustrating codeword encoding of the second intermediate lookup table 304 of FIG. 7.

The first intermediate lookup table 303 may include codeword mappings that support a mitigated MTA requirement. The first intermediate lookup table 303 may satisfy the MTA requirement that allows the MT event in the boundary block BB while satisfying the MTA requirement between symbols in each codeword, as shown in FIG. 8A.

The first intermediate lookup table 303 may include codewords according to multiple symbol encodings 601 to 604 in the symbols s[0], s[1], s[2], and s[3] of each codeword, as shown in FIG. 8B. The symbol encodings 601 to 604 may include at least one symbol of level +3 in the codeword by allowing the MT event in the boundary block BB while satisfying the MTA requirement between symbols.

For example, the symbol encoding 601 may provide twelve codewords (2*1*2*3=12) configured such that there is no MT event between symbols when the second symbol s[1] is level +3. The symbol encoding 602 may provide twelve codewords (3*2*1*2=12) configured such that there is no MT event between symbols when the third symbol s[2] is level +3. The symbol encoding 603 may provide twelve codewords (2*3*2*1=12) configured such that there is no MT event between symbols when the fourth symbol s[3] is level +3. The symbol encoding 604 may provide twelve codewords (1*2*3*2=12) configured such that the first symbol s[0] is level +3 and there is no MT event between symbols. The symbol encoding 604 may provide codewords (12−1=11) obtained by subtracting any one of 12 codewords, e.g., a codeword in which the symbols s[0], s[1], s[2] and s[3] are {+3, +1, +1, −1}. Accordingly, the first intermediate lookup table 303 may include forty-seven codewords (36+11=47) according to the symbol encodings 601 to 604.

The second intermediate lookup table 304 may include codeword mappings that support a combined MTA requirement and MDC requirement. The second intermediate lookup table 304 may be provided to partially satisfy the MTA requirement and the MDC requirement. The second intermediate lookup table 304 may satisfy the MTA requirement that allows an MT event between symbols at most one time, as shown in FIG. 9A. The second intermediate lookup table 304 may include codewords including level −3 having the lowest DC power cost by the MT event from level −3 to level +3 or from level +3 to level −3 as the MT event is allowed at most one time. Accordingly, the second intermediate lookup table 304 may satisfy the combined MTA requirement and MDC requirement that supports a part of the MTA requirement and a part of the MDC requirement.

The second intermediate lookup table 304 may include codewords according to multiple symbol encodings 701 to 704 in the symbols s[0], s[1], s[2], and s[3] of each codeword, as shown in FIG. 9B. The symbol encodings 701 to 704 may include at least one symbol of level +3 in a codeword by allowing the MT event between symbols at most one time. Accordingly, the MT event may be present one time or may not be present in the codewords according to the symbol encodings 701 to 704.

For example, the symbol encoding 701 may provide twelve codewords (2*1*2*3=12) in which the MT event between the first symbol s[0] and the second symbol s[1] is present one time when the second symbol s[1] is level +3. The symbol encoding 702 may provide twelve codewords (3*2*1*2=12) in which the MT event between the third symbol s[2] and the fourth symbol s[3] is present one time when the third symbol s[2] is level +3. The symbol encoding 703 may provide twelve codewords (2*3*2*1=12) configured such that there is no MT event between symbols when the fourth symbol s[3] is level +3. The symbol encoding 704 may provide twelve codewords (1*2*3*2=12) configured such that there is no MT event between symbols when the first symbol s[0] is level +3. The symbol encoding 704 may provide codewords (12−1=11) obtained by subtracting any one of 12 codewords, e.g., a codeword in which levels of the symbols s[0], s[1], s[2] and s[3] are {+3, +1, +1, −1}. Accordingly, the second intermediate lookup table 304 may include forty-seven codewords (12+12+12+11=47) according to the symbol encodings 701 to 704.

Figure 10:
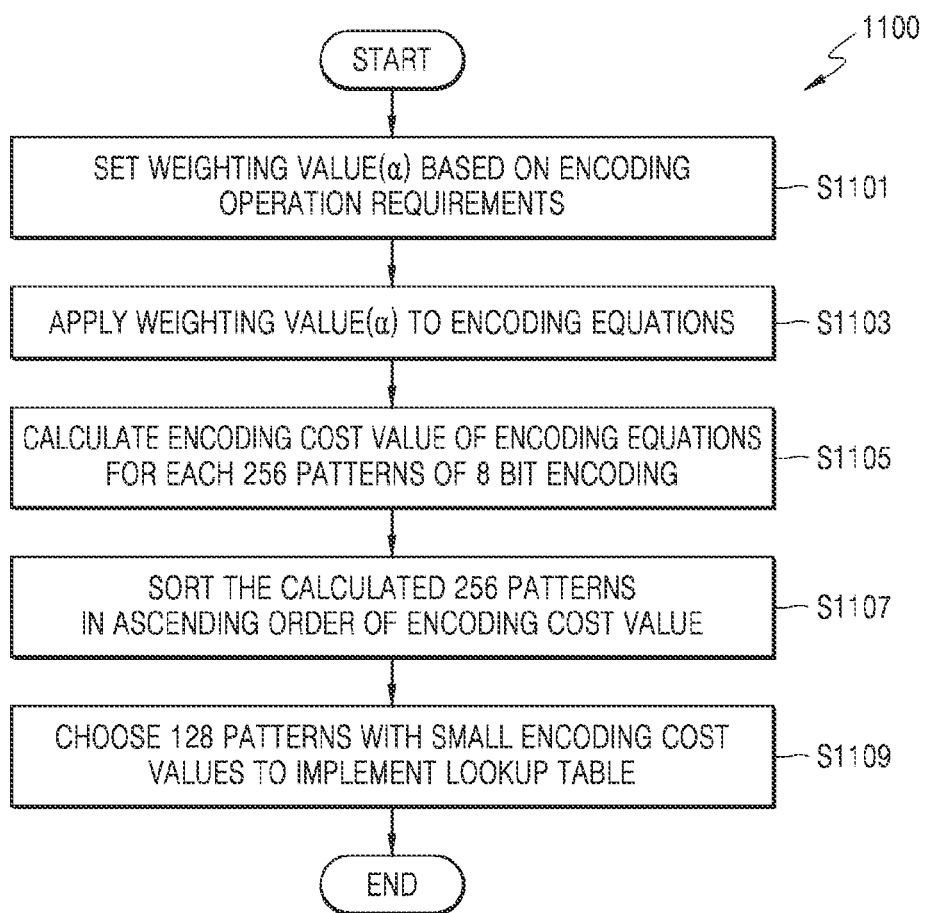
FIG. 10 is a diagram illustrating a codeword implementation method applied to lookup tables of the PAM-4 encoder of FIGS. 3 and 7.

FIG. 10 is a diagram illustrating a codeword implementation method applied to lookup tables of the PAM-4 encoder 112 of FIGS. 3 and 7.

Referring to FIG. 10 in conjunction with FIGS. 1, 2, 3, and 7, the PAM-4 encoder 112 may implement the lookup tables providing codewords of 8 bits corresponding to user data of 7 bits by using a codeword generation method 1100. The codeword generation method 1100 may convert the 7 bits of user data into 8 bits of the corresponding codeword symbols s[0], s[1], s[2] and s[3] by using Equations 1 to 3.

In operation S1101, the PAM-4 encoder 112 sets a weighting value $\alpha$ based on encoding operation requirements. The weighting value $\alpha$ may be configured to be associated with an MT within a codeword ci[7:0] block with respect to 7 bits of a first half-data burst and/or a codeword ci[15:8] block with respect to 7 bits of a second half-data burst on each DQ[i] serial data line.

In operation S1103, the weighting value $\alpha$ may be applied to Equation 1 in order to calculate an encoding cost value Cost(x) with respect to a codeword x. For example, a weighting value $\alpha=0$ may be applied to implement the MTA lookup table 302, a weighting value $\alpha=1$ may be applied to implement the MDC lookup table 305, and a weighting value $0<\alpha<1$ may be applied to implement the first intermediate table 303 or the second intermediate lookup table 304.

$$\text{Cost}(x) = (1-\alpha)\frac{\text{Count}_{MT}(x)}{Ex[\text{Count}_{MT}(X)]} + \alpha\frac{\text{Cost}_{DC}(x)}{Ex[\text{Cost}_{DC}(X)]} \quad \text{[Equation 1]}$$

Here, Cost(x) denotes the encoding cost value with respect to the codeword x, and $\alpha$ denotes a weighting factor that adapts to the encoding operation requirement of the PAM-4 encoder 112. $E_X[\text{Count}_{MT}(X)]$ denotes an MT average value with respect to all 256 codewords corresponding to 8 bits, and $Ex[\text{Cost}_{DC}(X)]$ denotes an average value of DC power costs with respect to all 256 codewords. $\text{Count}_{MT}(x)$ denotes the number of MTs with respect to symbols of the codeword x, and $\text{Cost}_{DC}(x)$ denotes the sum of DC power costs with respect to symbols of the codeword.

In operation S1105, the PAM-4 encoder 112 may calculate the encoding cost value Cost(x) with respect to 256 codewords by using Equation 1 in a weighting value $\alpha>0$. The encoding cost value Cost(x) may be calculated with respect to all 256 codewords by using an average DC power cost value of MT events between the symbols s[0], s[1], s[2] and s[3], the number of MT events of each of the 256 codewords, and the sum of the DC power costs.

In operation S1105, the PAM-4 encoder 112 may calculate the encoding cost value Cost(x) with respect to the codeword x without an MT in the weighting value $\alpha>0$ by using Equation 2. The weighting value $\alpha=0$ may be configured to be associated with MDC codewords of a small DC power cost value among MTA codewords within the 256 codewords.

$$\text{Cost}(x)=\text{Count}_{MT}(x)+\text{Cost}_{DC}(x) \quad \text{[Equation 2]}$$

Here, $\text{Count}_{MT}(x)=0$.

In operation S1105, the PAM-4 encoder 112 may calculate the encoding cost value Cost(x) with respect to the codeword x in which at least one MT exists in the weighting value $\alpha=0$ by using Equation 3. In this regard, in order to increase the DC power cost value when a first symbol of the codeword x is level +3, an arbitrary constant, for example, +0.5, may be arithmetically added to Cost(x).

$$\text{Cost}(x)=\text{Count}(x)+\text{Count}_{MT}(x)+M, M>\max(\text{Count}_{MT}(x)+\text{Cost}_{DC}(|x|)) \quad \text{[Equation 3]}$$

Here, M may be set to a value greater than the maximum value among absolute values of $\text{Count}_{MT}(x)+\text{Cost}_{DC}(|X|)$.

In operation S1107, the PAM-4 encoder 112 may sort the encoding cost values Cost(x) of the 256 codewords calculated by applying the weighting value $\alpha$ in operation S1105 in ascending order.

In operation S1109, the PAM-4 encoder 112 may preferentially select codewords having a small (e.g., smallest) encoding cost value Cost(x) from among the 256 codewords arranged in ascending order. The PAM-4 encoder 112 may implement a lookup table including the selected codewords. For example, the PAM-4 encoder 112 may select 128 of the 256 codewords having a lowest encoding cost value.

In FIG. 10, the encoding cost value Cost(x) combined with 7:8-bit encoding is described, but the encoding cost value Cost(x) may also be combined with various bit encodings, for example, 14:16-bit encoding. According to an embodiment, (n−p):n-bit encoding in which user data (n−p) (n>p) bits are converted into codewords of n bits may set the weighting value $\alpha$ indicating the operation requirement of bit encoding, and calculate the encoding cost value Cost(x) with respect to each of $2^n$ codewords of n bits using the weighting value $\alpha$. The encoding cost value Cost(x) may be calculated based on an average value of MT events between symbols and an average value of DC power costs with respect to all $2^n$ codewords, the number of MT events of each of the $2^n$ codewords, the sum of the DC power costs and the weighting value $\alpha$. (n−p):n-bit encoding may select $2^{n-p}$ codewords having a small encoding cost value Cost(x) from among the $2^n$ codewords, and map the selected $2^{n-p}$ codewords to the user data (n−p) bits.

Figure 11:
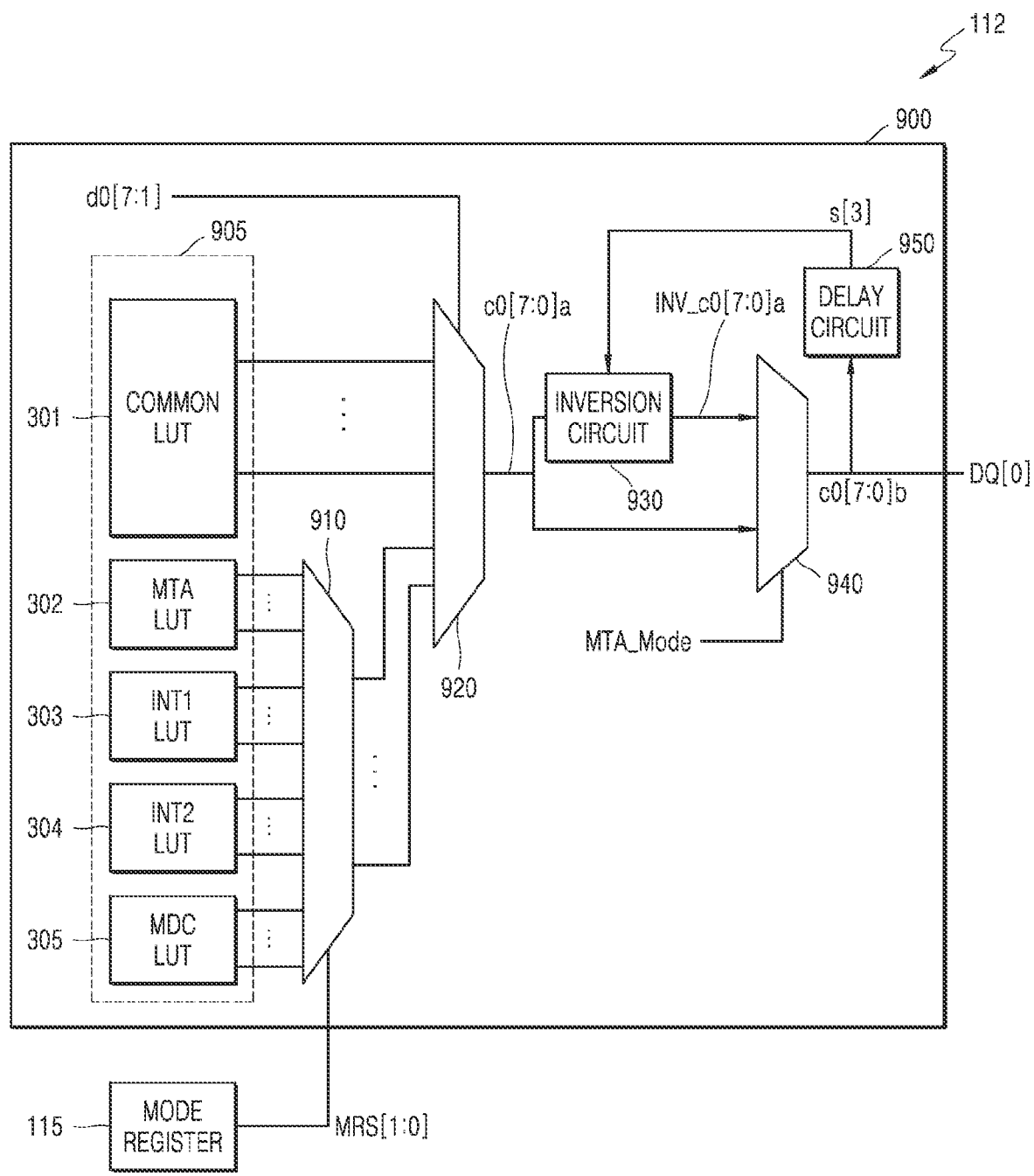
FIG. 11 is a circuit diagram illustrating the PAM-4 encoder of FIG. 1.

FIG. 11 is a circuit diagram illustrating the PAM-4 encoder 112 of FIG. 1. Hereinafter, the PAM-4 encoder 112 collectively refers to implementing in hardware, firmware, software, or a combination thereof for configuring an encoding circuit 900.

Referring to FIG. 11, the PAM-4 encoder 112 may include the encoding circuit 900 connected to the data line DQ[0]. The encoding circuit 900 may include lookup tables 905, a first multiplexer circuit 910, a second multiplexer circuit 920, an inversion circuit 930, a third multiplexer circuit 940 and a delay circuit 950. For the sake of brevity of the figure, although the encoding circuit 900 of data line DQ[0] is shown in FIG. 11, the encoding circuit 900 may be repeated with respect to the other data line DQ[i] in the same way. For example, the encoding circuit 900 may output a codeword correlated to a first codeword C0[7:0]a corresponding to data d0[7:1] provided to the second multiplexer circuit 920 to data line DQ[0], and may output a codeword correlated with an i-th codeword Ci[7:0]a corresponding to the data di[7:1] to the data line DQ[i].

The lookup tables 905 may include a group of registers that store codewords of the common lookup table 301, the MTA lookup table 302, the first and second intermediate lookup tables 303 and 304 and the MDC lookup table 305 described with reference to FIGS. 3 to 10.

The first multiplexer circuit 910 may be connected to registers constituting the MTA lookup table 302 of the lookup tables 905, the first and second intermediate lookup tables 303 and 304, and the MDC lookup table 305. The first multiplexer circuit 910 may select one of the MTA lookup table 302, the first and second intermediate lookup tables 303 and 304, and the MDC lookup table 305 based on a first mode selection signal MRS[1:0]. Codewords of the selected lookup table may be output to the second multiplexer circuit 920.

The first mode selection signal MRS[1:0] represents an operation parameter code related to encoding operation requirements of the PAM-4 encoder 112. The first mode selection signal MRS[1:0] may be provided from a mode register 115 that stores various operation and control parameters used to set operating conditions with respect to the transmitter 110.

For example, according to an encoding operating condition in which the PAM-4 encoder 112 supports an entire MTA requirement, the first mode selection signal MRS[1:0] may be provided as a "00" code. The first multiplexer circuit 910 may output codewords of the MTA lookup table 302 to the second multiplexer circuit 920 based on the first mode selection signal MRS[1:0] of the "00" code. According to an encoding operation condition in which the PAM-4 encoder 112 supports a mitigated MTA requirement, when the first mode selection signal MRS [1:0] is provided as a "01" code, the first multiplexer circuit 910 may select the first intermediate lookup table 303 and output codewords of the first intermediate lookup table 303 to the second multiplexer circuit 920. According to an encoding operating condition in which the PAM-4 encoder 112 supports a combined MTA requirement and MDC requirement, when the first mode selection signal MRS[1:0] is provided as a "10" code, codewords of the second intermediate lookup table 304 may be output to the second multiplexer circuit 920. According to an encoding operating condition in which the PAM-4 encoder 112 maximally supports the MDC requirements, when the first mode selection signal MRS [1:0] is provided as an "11" code, codewords of the MDC lookup table 305 may be output to the second multiplexer circuit 920.

The second multiplexer circuit 920 may be connected to registers constituting the lookup table selected by the first multiplexer circuit 910 and the common lookup table 301. The second multiplexer circuit 920 may output a first codeword C0[7:0]a corresponding to a data d0[7:1] bit value among the codewords of the selected lookup table and the common lookup table 301. The first codeword C0[7:0]a may be output to the inversion circuit 930 and the third multiplexer circuit 940.

The third multiplexer circuit 940 may input an inverted codeword INV_C0[7:0]a output from the inversion circuit 930 and the first codeword C0[7:0]a output from the second multiplexer circuit 920. The third multiplexer circuit 940 may select the inverted codeword INV_C0[7:0]a or the first codeword C0[7:0]a in response to a second mode selection signal MTA_Mode, and output the selected codeword as a second codeword c0[7:0]b.

The second mode selection signal MTA_Mode may be provided to prevent an MT event between a last symbol of a current codeword and a first symbol of a next codeword in a boundary block BB (FIG. 2). The second mode selection signal MTA_Mode is a signal activated when the first mode selection signal MRS [1:0] is set to support the MTA requirement, for example, based on the first mode selection signal MRS [1:0] of the "00" code.

The third multiplexer circuit 940 may select the inverted codeword INV_C0[7:0]a when the second mode selection signal MTA_Mode is activated and output the inverted codeword INV_C0[7:0]a as the second codeword c0[7:0]b. The third multiplexer circuit 940 may select the first codeword C0[7:0]a when the second mode selection signal MTA_Mode is inactivated, and output the inverted codeword INV_C0[7:0]a as the second codeword c0[7:0]b. The inverted codeword INV_C0[7:0]a or the second codeword c0[7:0]b) corresponding to the first codeword C0[7:0]a may be sent to the channel 130 (FIG. 1) connected to the data line DQ[0] and transmitted to the receiver 120.

The inversion circuit 930 may input the current first codeword C0[7:0]a output from the third multiplexer circuit 940, and invert bits of the first codeword C0[7:0] a based on an output of the delay circuit 950. The delay circuit 950 may store the previous first codeword C0[7:0]a output from the third multiplexer circuit 940, and provide the last symbol s[3] of the previous first codeword C0[7:0]a to the inversion circuit 930.

The inversion circuit 930 may determine whether the MT event occurs between the last symbol s[3] of the previous first codeword C0[7:0]a and the first symbol s[0] of the current first codeword C0[7:0]a. The inversion circuit 930 may determine whether an MT event occurs, i.e., a transition from the highest voltage level to the lowest voltage level or a transition from the lowest voltage level to the highest voltage level occurs between the last symbol s[3] and the first symbol s[0]. When the MT event occurs between the last symbol s[3] of the previous first codeword C0[7:0]a and the first symbol s[0] of the current first codeword C0[7:0]a, the inversion circuit 930 may invert the current first codeword C0[7:0]a to generate the inverted codeword INV_C0[7:0]a. When no MT event occurs, the inversion circuit 930 may output the current first codeword C0[7:0]a as the inverted codeword INV_C0[7:0]a. In an embodiment, the current first codeword C0[7:0] is output directly to the third multiplexer circuit 940 without passing through the inversion circuit 930.

For example, the inversion circuit 930 may determine whether the last symbol s[3] of the previous first codeword C0[7:0]a is a symbol bit "10" corresponding to level +3. As a result of determination, when the last symbol bit of the previous first codeword C0[7:0]a is "10" and the first symbol bit of the current first codeword C0[7:0]a is "00", the inversion circuit 930 may invert the current first codeword C0[7:0]a to generate the inverted codeword INV_C0[7:0]a. The inverted codeword INV_C0[7:0]a may be output as the second codeword c0[7:0]b through the third multiplexer circuit 940 when the second mode selection signal MTA_Mode is activated. The second codeword c0[7:0] corresponding to the inverted codeword INV_C0[7:0]a may be sent to the channel 130 (FIG. 1) connected to the data line DQ[0] and transmitted to the receiver 120. In an embodiment, the inversion circuit 930 or the encoding circuit 900 activates or deactivates the second mode selection signal MTA_Mode and outputs the second mode selection signal MTA_Mode to the third multiplexer circuit 940.

Meanwhile, the codewords output by the first and second multiplexer circuits 910 and 920 may include codewords in which no MT event occurs in the boundary block BB between the codewords, for example, codewords of MTA coding. In this case, the case where a last symbol of a previous codeword is level +3 does not occur. The inversion circuit 930 may be configured to determine whether symbol bits of the input current first codeword c0[7:0]a are inverted. The inversion circuit 930 may invert the current first codeword c0[7:0]a based on a least significant bit (LSB) "0" that is common to the symbol bit "10" of level +3 or the symbol bit "00" of level −3. The inversion circuit 930 may invert the first codeword C0[7:0]a in response to the LSB symbol bit "0" of the input first codeword C0[7:0]a to generate the inverted codeword INV_C0[7:0].

According to an embodiment, the lookup tables 905 may be implemented as multiple multiplexer circuits or may be optimized and implemented as functionally identical logic circuits.

Figure 12A:
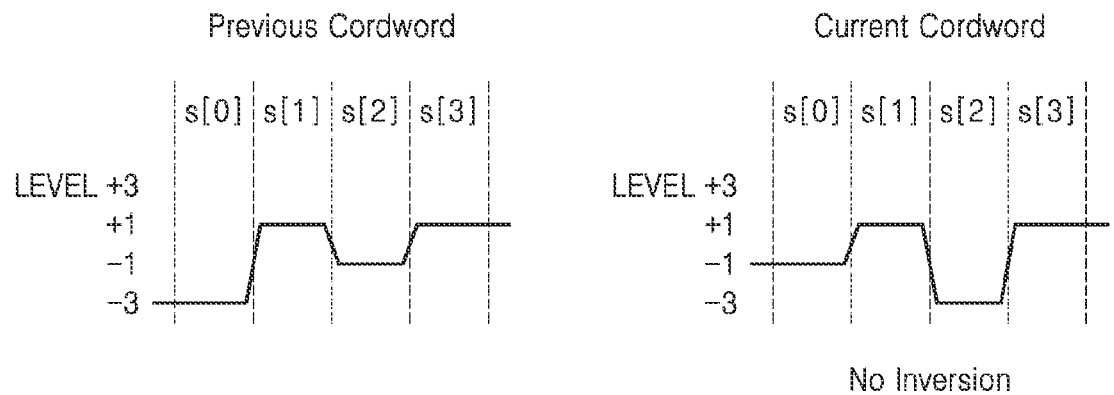
FIGS. 12A and 12B are diagrams illustrating a codeword inversion scheme in a boundary block according to an embodiment of the inventive concept.
Figure 12B:
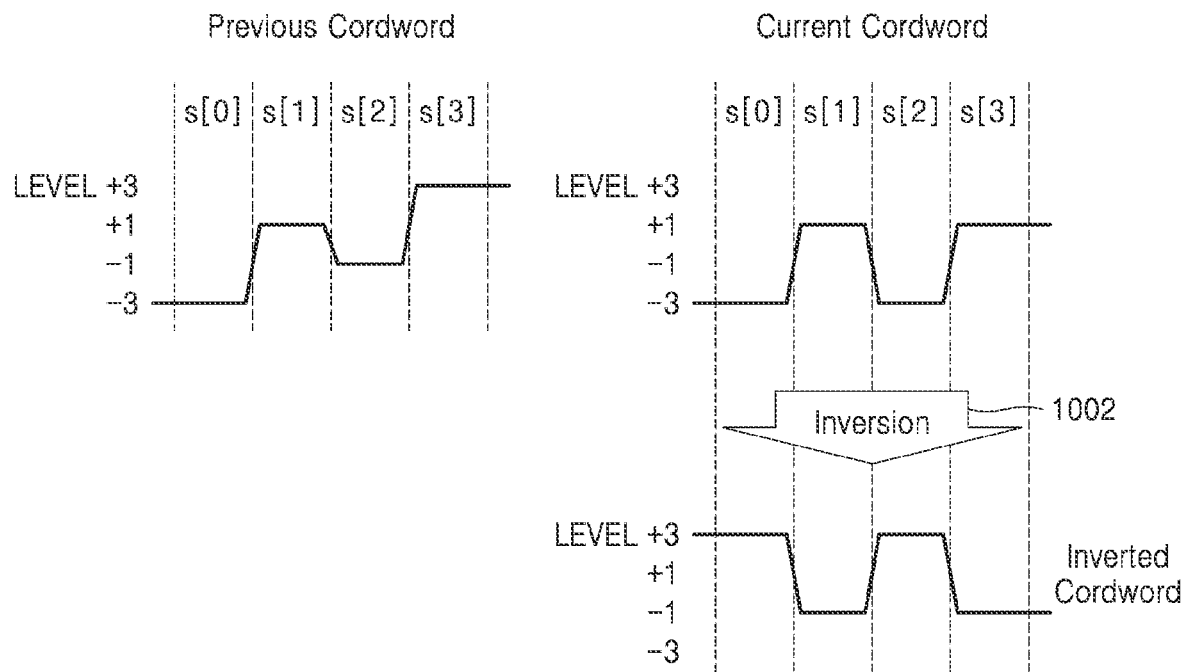

FIGS. 12A and 12B are diagrams illustrating a codeword inversion scheme in the boundary block BB according to an embodiment of the inventive concept. FIGS. 12A and 12B show the codeword inversion scheme performed by the inversion circuit 930 of FIG. 11.

Referring to FIGS. 11 and 12A, it is assumed that previous codeword symbols have levels {−3, +1, −1, +1}. When current codeword symbols input to the inversion circuit 930 have levels {−1, +1, −3, +1}, because the last symbol s[3] of the previous codeword provided from the delay circuit 950 does not correspond to level +3, the inversion circuit 930 does not perform codeword inversion on the levels {−1, +1, −3, +1} of the current codeword symbols.

Referring to FIG. 12B, it is assumed that the previous codeword symbols have levels {−3, +1, −1, +3}. When the current codeword symbols input to the inversion circuit 930 have levels {−3, +1, −3, +1}, because the last symbol s[3] of the previous codeword provided from the delay circuit 950 corresponds to level +3, the inversion circuit 930 may perform a codeword inversion 1002 that inverts the levels {−3, +1, −3, +1} of the current codeword symbols to output levels {+3, −1, +3, −1} of inverted codeword symbols.

Figure 13:
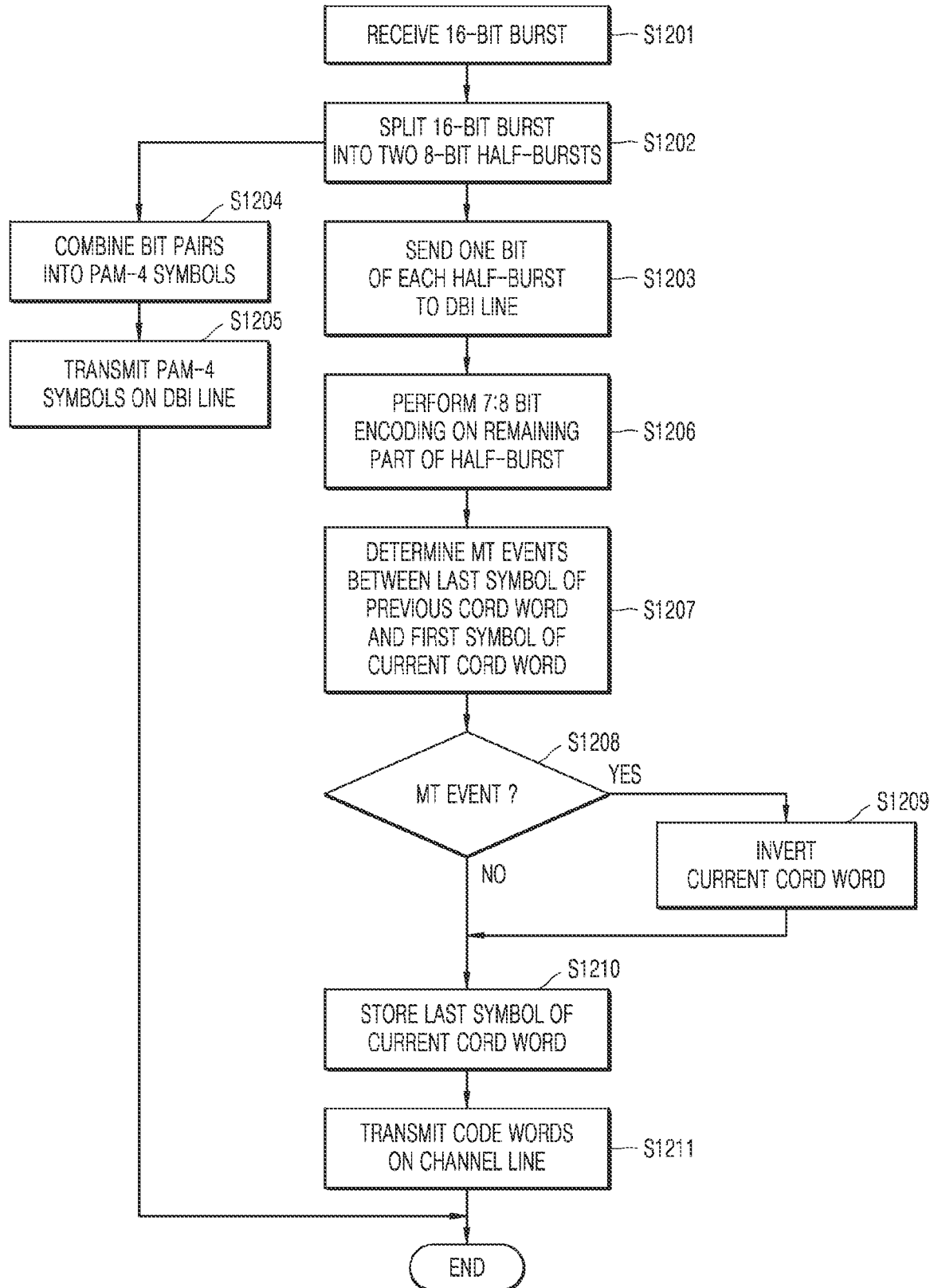
FIG. 13 is a flowchart illustrating an operation method of a PAM-4 encoder according to an embodiment of the inventive concept.

FIG. 13 is a flowchart illustrating an operation method of the PAM-4 encoder 112 according to an embodiment of the inventive concept.

Referring to FIG. 13 in conjunction with FIGS. 2 to 12, in operation S1201, the PAM-4 encoder 112 may receive 16-bit data bursts to be transmitted to the data line DQ[0]. In operation S1202, the PAM-4 encoder 112 may split the 16-bit data burst into a first half-data burst d0[0]d0[7:1] and a second half-data burst d0[8]d0[15:9]. In operation S1203, the PAM-4 encoder 112 may send one bit of each half-data burst, for example, d0[0] and d0[8], to a DBI signal line. In operations S1204 and S1205, the PAM-4 encoder 112 may combine bit pairs d0[0] and d0[8] into PAM-4 symbols, and transmit the PAM-4 symbol to the DBI signal line.

In operation S1206, the PAM-4 encoder 112 may perform encoding by which the remaining 7 bits not used as the PAM-4 symbols of the DBI signal line of each half-data burst are converted into a codeword. In operations S1207 and S1208, the PAM-4 encoder 112 may determine whether an MT event occurs between the last symbol s[3] of a previous codeword and the first symbol s[0] of a current codeword. As a result of a determination in operation S1208, when an MT event occurs (YES), the PAM-4 encoder 112 may advance to operation S1209. In operation S1209, the PAM-4 encoder 112 may invert the current codeword and advance to operation S1210. As a result of determination in operation S1208, when no MT event occurs (NO), the PAM-4 encoder 112 may advance to operation S1210. In operation S1210, the PAM-4 encoder 112 may store the last symbol s[3] of the current codeword in the delay circuit 950. In operation S1211, the PAM-4 encoder 112 may transmit the codeword with respect to 7 bits of each half-data burst to the channel 130.

Figure 14:
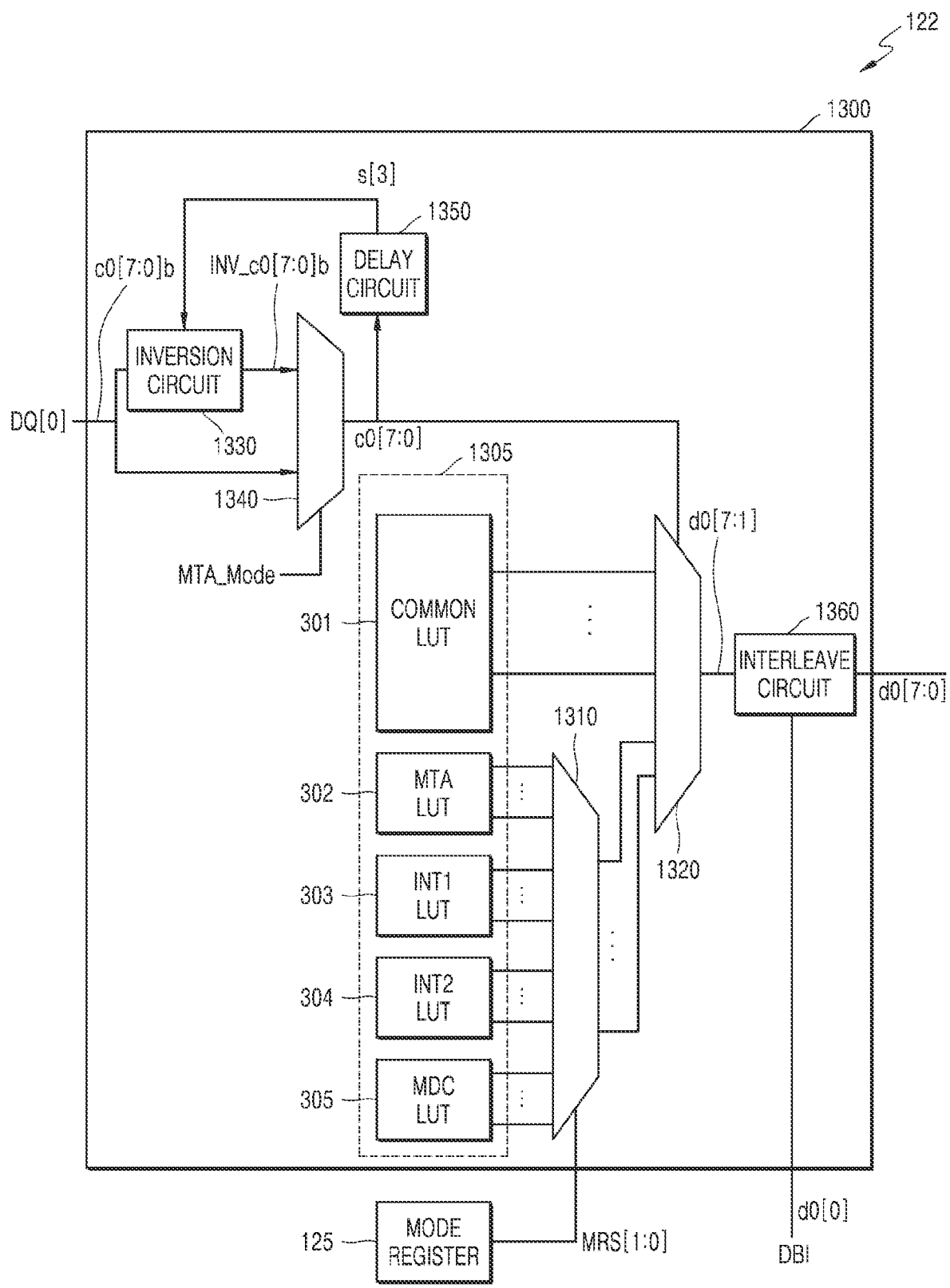
FIG. 14 is a circuit diagram illustrating a PAM-4 decoder according to an embodiment of the inventive concept.

FIG. 14 is a circuit diagram illustrating the PAM-4 decoder 122 according to an embodiment of the inventive concept. Hereinafter, the PAM-4 decoder 122 collectively refers to implementing in hardware, firmware, software, or a combination thereof for configuring a decoding circuit 1300.

Referring to FIGS. 1 and 14, the PAM-4 decoder 122 includes the decoding circuit 1300 that performs 8:7 bit decoding on the data line DQ[0] in correspondence to the encoding circuit 900 of FIG. 9. The decoding circuit 1300 may include lookup tables 1305, a first multiplexer circuit 1310, a second multiplexer circuit 1320, an inversion circuit 1330, a third multiplexer circuit 1340, a delay circuit 1350, and an interleave circuit 1360. The decoding circuit 1300 may be repeated with respect to the other data lines DQ[i] in the same manner.

The lookup tables 1305 may include a group of registers that store codewords of the common lookup table 301, the MTA lookup table 302, the first and second intermediate lookup tables 303 and 304 and the MDC lookup table 305 described with reference to FIGS. 3 to 10. The lookup tables 1305 are configured the same as the lookup table 905 of the encoding circuit 900, but input/output coding relationships may be configured opposite to each other. According to an embodiment, the lookup tables 1305 may be implemented as multiple multiplexer circuits or may be optimized and implemented as functionally identical logic circuits.

The decoding circuit 1300 may receive the second codeword c0[7:0]b transmitted from the encoding circuit (900 of FIG. 11) to the data line DQ[0], and may provide the second codeword c0[7:0]b to the inversion circuit 1330 and the third multiplexer circuit 1340.

The third multiplexer circuit 1340 may input an inverted codeword INV_c0[7:0]b output from the inversion circuit 1330 and the second codeword c0[7:0]b. The third multiplexer circuit 1340 may select the inverted codeword INV_c0[7:0]b or the second codeword c0[7:0]b in response to the second mode selection signal MTA_Mode, and output the selected codeword as a third codeword c0[7:0]. The second mode selection signal MTA_Mode has the same function as that of the second mode selection signal MTA_Mode described with reference to the encoding circuit 900 of FIG. 9, and may be provided to prevent an MT event in the boundary block BB (FIG. 2).

The second codeword C0[7:0]b may be output as the third codeword c0[7:0] through the third multiplexer circuit 1340 according to the inactivation of the second mode selection signal MTA_Mode. The third codeword c0[7:0] corresponding to the second codeword c0[7:0]b may be provided to the second multiplexer circuit 1320.

The delay circuit 1350 may store the previous third codeword c0[7:0] output from the third multiplexer circuit 1340, and provide the last symbol s[3] of the previous third codeword c0[7:0] to the inversion circuit 1330.

The inversion circuit 1330 may determine whether the last symbol s[3] of the previous third codeword c0[7:0] is a symbol corresponding to level +3. The inversion circuit 1330 may also determine whether the first symbol s[0] of the received current second codeword c0[7:0]b is level +3. When the last symbol s[3] of the previous third codeword c0[7:0] is level +3 and the first symbol s[0] of the current second codeword c0[7:0]b is level +3, the inversion circuit 1330 may determine that the current second codeword c0[7:0]b is inverted by the PAM-4 encoder 112. In this case, the inversion circuit 1330 may invert the current second codeword c0[7:0b] to generate the inverted codeword INV_c0[7:0]b. The inverted codeword INV_c0[7:0]b may be output as the third codeword c0[7:0] through the third multiplexer circuit 1340 according to the activation of the second mode selection signal MTA_Mode. The third codeword c0[7:0] corresponding to the inverted codeword INV_c0[7:0]b may be provided to the second multiplexer circuit 1320.

The decoding circuit 1300 may receive the second codeword c0[7:0]b of MTA coding in which no MT event occurs in the boundary block BB between codewords. In this case, the case where a last symbol of a previous codeword is level 3 does not occur. According to an embodiment, the inversion circuit 1330 may be configured to determine whether symbol bits of the sequentially input second codeword c0[7:0]b are inverted. The inversion circuit 1330 may invert the current second codeword c0[7:0]b based on the symbol bit "10" of the level +3 and the symbol bit "00" of the level −3 with respect to the input current second codeword c0[7:0]b. The inversion circuit 930 may invert the second codeword c0[7:0]b in response to the LSB symbol bit "0" of the input second codeword c0[7:0]b to generate the inverted codeword INV_C0[7:0]b.

According to an embodiment, the inversion circuit 1330 may determine whether the symbol bits are inverted in response to a separate inversion signal provided from the transmitter 110 (FIG. 1), and may invert the symbol bits according to results of determination.

The first multiplexer circuit 1310 may be connected to registers constituting the MTA lookup table 302 of the lookup tables 1305, the first and second intermediate lookup tables 303 and 304, and the MDC lookup table 305 and select one of the MTA lookup table 302, the first and second intermediate lookup tables 303 and 304, and the MDC lookup table 305 in response to a first mode selection signal MRS [1:0]. Codewords of the selected lookup table may be output to the second multiplexer circuit 1320. The first mode selection signal MRS [1:0] has the same function as an operation parameter code related to encoding operation requirements of the PAM-4 encoder 112 described with reference to FIG. 11.

The first mode selection signal MRS [1:0] may be provided from the mode register 125 that stores various operation and control parameters used to set operating conditions with respect to the receiver 120. For example, the MTA lookup table 302 may be selected based on the first mode selection signal MRS [1:0] of a "00" code, the second intermediate lookup table 304 may be selected based on a "10" code, and the MDC lookup table 305 may be selected based on a "11" code, in the same manner as the encoding operation conditions set for the transmitter 110, That second mode selection signal MTA_Mode is a signal activated based on the first mode selection signal MRS [1:0] of the "00" code.

The second multiplexer circuit 1320 may be connected to registers constituting the lookup table selected by the first multiplexer circuit 1310 and the common lookup table 301 according to the first mode selection signal MRS [1:0], and may output a data bit value d0[7:1] corresponding to the third codeword c0[7:0] among the codewords of the selected lookup table and the common lookup table 301. The data bit value d0[7:1] may be provided to the interleave circuit 1360.

The interleave circuit 1360 may receive data d0[7:1] output from the second multiplexer circuit 1320 and data d0[0] of the PAM-4 symbol received through the DBI signal line, and combine the data d0[0] and d0[7:1] to recover a first half-data burst d0[0]d0[7:1]. Similarly, the interleave circuit 1360 may receive data d0[15:9] and data d0[8] received through the DBI signal line, and combine the data d0[8] and d0[15:9] to recover a second half-data burst d0[8]d0[15:9]. The decoding circuit 1300 may recover full data bursts by combining the half-data bursts with respect to each serial data line DQ[i].

Figure 15:
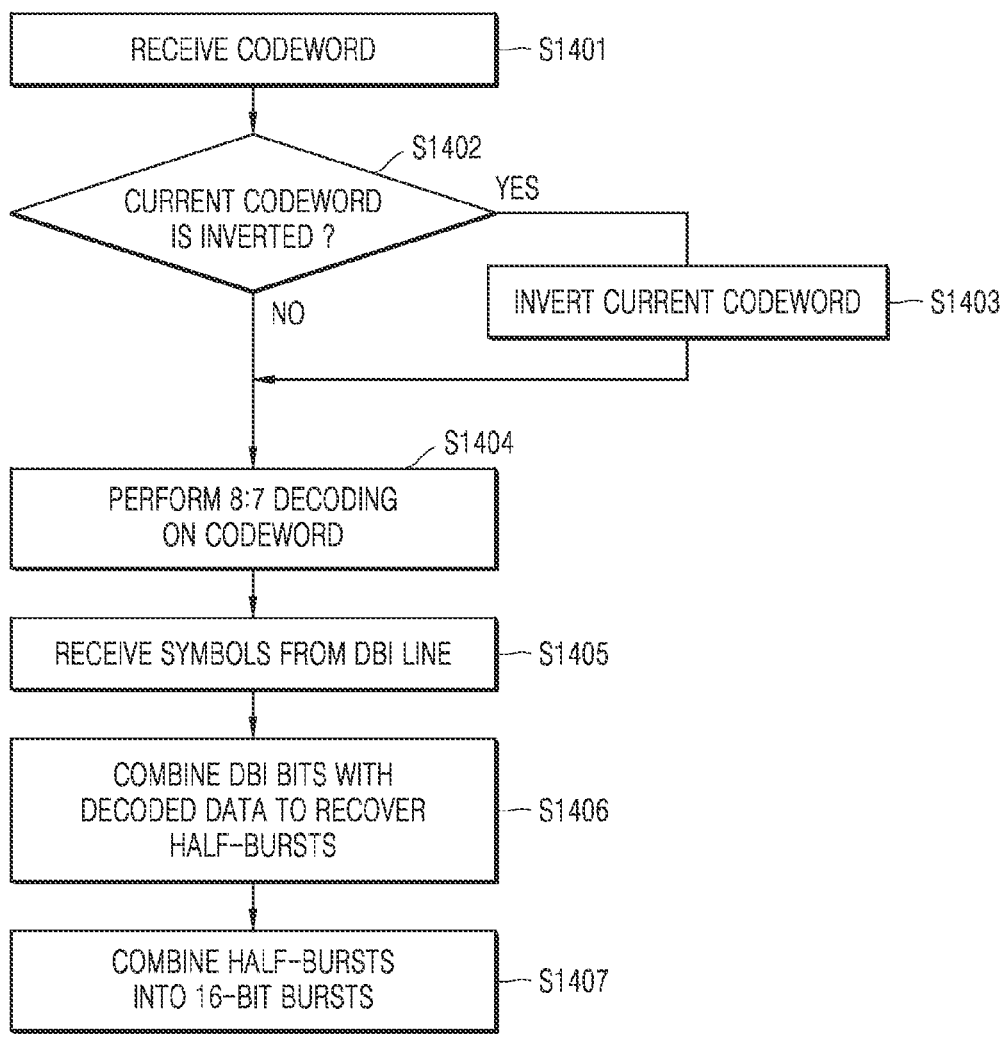
FIG. 15 is a flowchart illustrating an operation method of a PAM-4 decoder according to an embodiment of the inventive concept.

FIG. 15 is a flowchart illustrating an operation method of the PAM-4 decoder 122 according to an embodiment of the inventive concept.

Referring to FIG. 15 in conjunction with FIGS. 1, 2, 11 and 14, in operation S1401, the PAM-4 decoder 122 may receive the second codeword c0[7:0]b through the data line DQ[0] of the channel 130. In operation S1402, the PAM-4 decoder 122 may determine whether the received second codeword c0[7:0]b is an inverted codeword. As a result of the determination of operation S1402, when the received second codeword c0[7:0]b is the inverted codeword, the PAM-4 decoder 122 may advance to operation S1403. In operation S1403, the PAM-4 decoder 122 may invert the second codeword c0[7:0]b and output the second codeword c0[7:0]b as the third codeword c[7:0], and advance to operation S1404. The PAM-4 decoder 122 may invert the current codeword in operation S1403 and advance to operation S1404. As a result of the determination of operation S1402, when the received second codeword c0[7:0]b is not the inverted codeword (NO), the PAM-4 decoder 122 may output the second codeword c0[7:0]b as the third codeword c[7:0], and advance to operation S1404.

In operation S1404, the PAM-4 decoder 122 may perform 8:7-bit decoding by which the third codeword c0[7:0] is converted into the data d0[7:1]. In operation S1405, the PAM-4 decoder 122 may receive the PAM-4 symbol through the DBI signal line of the channel 130. In operation S1406, the PAM-4 decoder 122 may combine the data d0[0] of the received PAM-4 symbol and the decoded d0[7:1] to recover the first half-data burst d0[0]d0[7:1].

In order to recover second half-data bursts with respect to the data line DQ[0], the PAM-4 decoder 122 may receive and decode the codeword c0[15:8]b, convert the codeword c0[15:8]b into the data d0[15:9], and combine d0[8] of the PAM-4 symbol received through the DBI signal line and the decoded data d0[15:9] to recover the second half-data burst d0[8]d0[15:9] in operations S1401 to S1406. For example, operations S1401 to S1406 may performed twice to recover both half-data bursts.

In operation S1407, the PAM-4 decoder 122 may combine the first half-data burst d0[0]d0[7:1] and the second half-data burst d0[8]d0[15:9] to recover the full data burst.

Figure 16A:
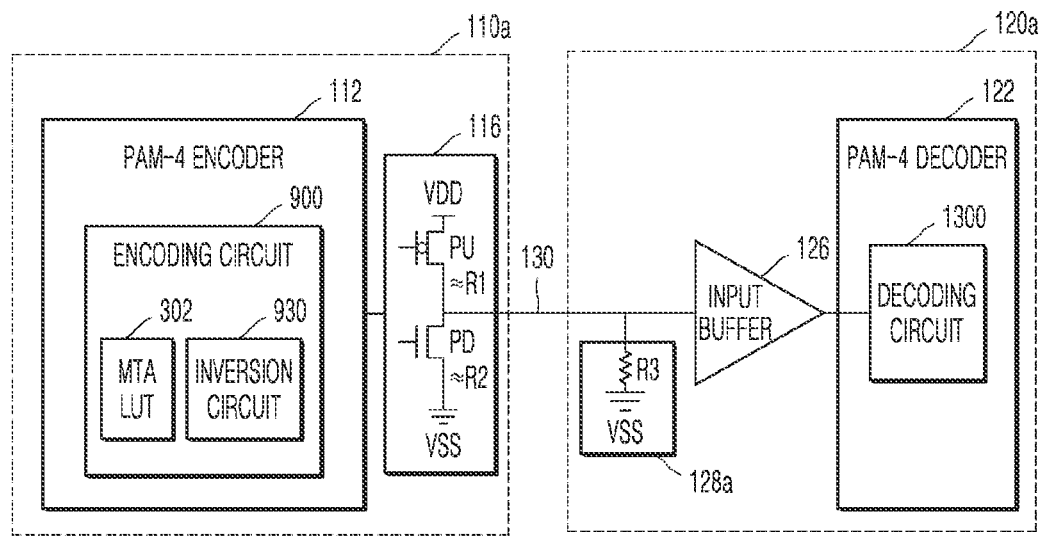
FIGS. 16A and 16B are diagrams conceptually illustrating a symmetric ODT circuit in relation to a transmitter and a receiver according to an embodiment of the inventive concept.
Figure 16B:
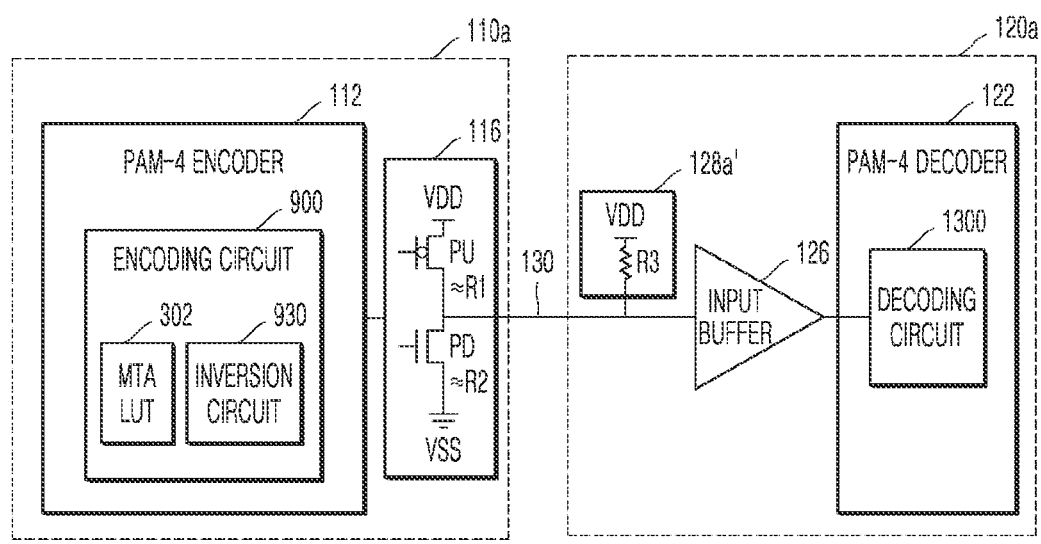
Figures 17, 18A:
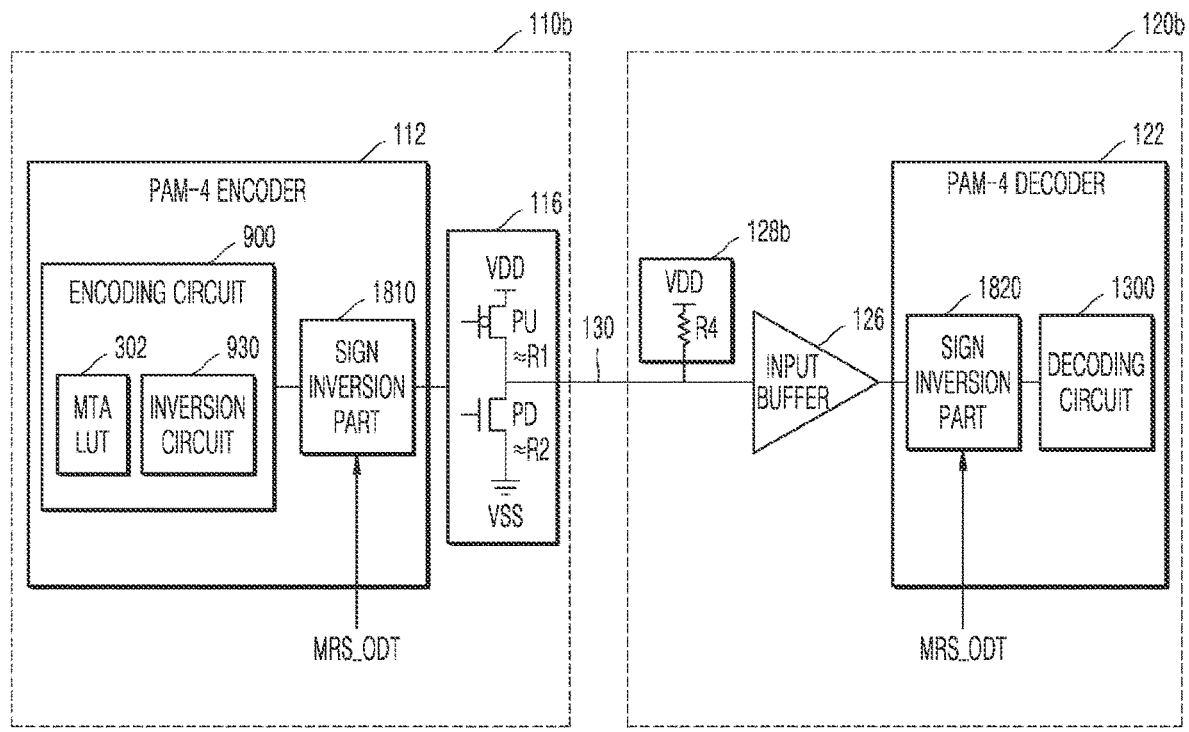

FIGS. 16A and 16B are diagrams conceptually illustrating a symmetric ODT circuit in relation to a transmitter 110a and a receiver 120a according to an embodiment of the inventive concept. FIG. 16A shows the symmetric ODT circuit including a ground voltage VSS ODT between the transmitter 110a and the receiver 120a, and FIG. 16B shows a symmetric ODT circuit including a supply voltage VDD ODT. FIG. 17 is a diagram illustrating symbols of a codeword applied to a ground voltage VSS ODT target between the transmitter 110a and the receiver 120a of FIG. 16A.

Referring to FIG. 16A, the transmitter 110a may transmit the codeword output from the encoding circuit 900 of the PAM-4 encoder 112 to the channel 130 through the output buffer 116. The codeword may be provided from the MTA lookup table 302 including codewords in which no MT event occurs between the symbols described with reference to FIGS. 5A and 5B and no MT event occurs even in the block boundary BB. In addition, when an MT event between the block boundary BB occurs based on a last symbol of a previous codeword and a first symbol of a current codeword, the codeword may be provided as an inverted codeword by the inversion circuit 930 that performs codeword inversion on the current codeword symbols. Accordingly, the codeword output from the encoding circuit 900 may be an encoded codeword including many symbol level −3 having a zero (0) current level and zero (0) DC cost value corresponding to the ground voltage VSS level and transmitted with low power.

The output buffer 116 may include a pull-up transistor PU connected between the supply voltage line VDD and the channel 130 and a pull-down transistor PD connected between the channel 130 and the ground voltage VSS line. In FIG. 16A, one pull-up transistor PU and one pull-down transistor PD are illustrated, but each of the pull-up transistor PU and the pull-down transistor PD may be replaced by a plurality of transistors. Some of gates of the pull-up transistor PU and the pull-down transistor PD may receive the codeword output from the encoding circuit 900, and the remaining ones may receive a ZQ calibration code. Accordingly, the pull-up transistor PU and the pull-down transistor PD may adjust a swing width and/or driving strength of the codeword transmitted to the channel 130 and provide a termination resistance to the channel 130.

A driving capability of each of the pull-up transistor PU and the pull-down transistor PD may be determined according to the symbol level −3, −1, +1, or +3 of the codeword. For convenience of description, it is assumed that the driving capability of each of the pull-up transistor PU and the pull-down transistor PD according to the codeword is modeled as a pull-up resistance value R1 and a pull-down resistance value R2.

When the input buffer 126 receives the codeword transmitted to the channel 130 through the output buffer 116, the receiver 120a may provide a termination resistor R3 with respect to the channel 130 by a termination circuit 128a. The termination circuit 128a may include the termination resistor R3 connected between the channel 130 and the ground voltage VSS line. The termination circuit 128a of the receiver 120a may include the symmetric ODT connected to the same voltage, i.e., the ground voltage VSS, with respect to a codeword level including many symbol levels −3 corresponding to the ground voltage VSS level.

Referring to FIG. 16B, the receiver 120a may include a termination circuit 128a' connected between the supply voltage VDD line and the channel 130, in comparison with FIG. 16A. A symmetric ODT state including the supply voltage VDD ODT may be between the transmitter 110a and the receiver 120a. The transmitter 110a may transmit the codeword provided from the MTA lookup table 302 of the PAM-4 encoder 112 to the channel 130 through the output buffer 116. The codeword may include symbols applied to the supply voltage VDD ODT target which will be described with reference to FIG. 19B. The MTA lookup table 302 may provide codewords encoded to correspond to the supply voltage VDD ODT target, for example, codewords including many symbol levels +3.

According to an embodiment, the PAM-4 encoder 112 may include the MTA lookup table 302 that adaptively provides corresponding codewords according to a ground voltage VSS ODT state or a supply voltage VDD ODT state between the transmitter 110a and the receiver 110b. The MTA lookup table 302 may include a first table including codewords including many symbol levels −3 corresponding to the ground voltage VSS ODT target and a second table including codewords including many symbol levels +3 corresponding to the supply voltage VDD ODT target.

Referring to FIG. 16A, the output buffer 116 of the transmitter 110a, the channel 130, and the termination circuit 128a of the receiver 120a may be modeled as shown in FIG. 17. Referring to FIG. 17, for impedance matching of the channel 130, the termination resistor R3 may be set to a resistance value R equal to the resistance value R of the channel 130. Each of the pull-up transistor PU and the pull-down transistor PD of the output buffer 116 may differently represent a pull-up modeling resistance value R1 and a pull-down modeling resistance value R2 according to the symbol level −3, −1, +1 or +3 of the codeword.

For example, with respect to the symbol level −3, the pull-up modeling resistance value R1 may be represented by an infinity value and the pull-down modeling resistance value R2 may be represented by the resistance value R. Accordingly, the symbol level −3 may have a zero (0) current level and a zero (0) DC cost value. With respect to the symbol level −1, as the pull-up modeling resistance value R1 is represented by a resistance value 3R and the pull-down modeling resistance value R2 is represented by the resistance value 1.5R, the symbol level −1 may have a 5VDD/18 current level and a DC cost value 5. With respect to the symbol level +1, as the pull-up modeling resistance value R1 is represented by the resistance value 1.5R and the pull-down modeling resistance value R2 is represented by the resistance value 3R, the symbol level +1 may have a 8VDD/18 current level and a DC cost value 8. With respect to the symbol level +3, as the pull-up modeling resistance value R1 is represented by the resistance value R and the pull-down modeling resistance value R2 is represented by the infinity value, the symbol level +3 may have a 9VDD/18 current level and a DC cost value 9. In the ground voltage VSS ODT state, as the number of symbol levels −3 of the codeword increases, the codeword may be transmitted with low power.

The ground voltage VSS ODT between the transmitter 110a and the receiver 120a described with reference to FIGS. 16A and 17 may be configured to enable codeword transmission of an MTA codeword with a low power supply. The codeword received through the input buffer 126 of the receiver 120a may be recovered as a data burst by the decoding circuit 1300 of the PAM-4 decoder 122 described with reference to FIG. 14.

Figures 19B, 20:
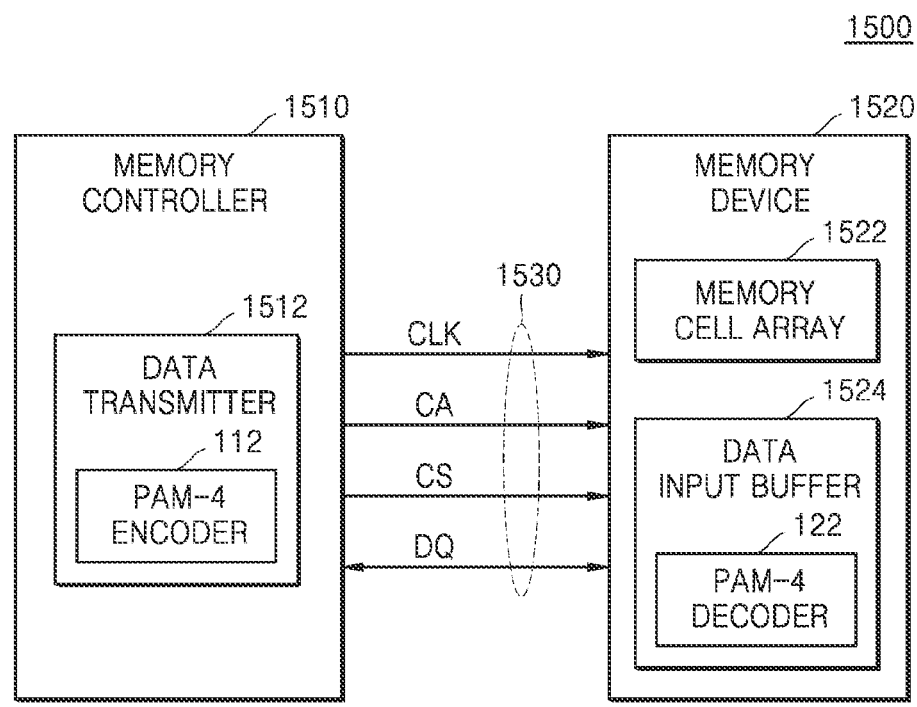
FIG. 19B is a diagram illustrating symbols of a codeword applied to a power voltage ODT target between a transmitter and a receiver.
FIG. 20 is a block diagram of a first example of a memory system including an encoding and decoding apparatus according to an embodiment of the inventive concept.

FIGS. 18A and 18B are diagrams conceptually illustrating an asymmetric ODT circuit in relation to a transmitter 110b and a receiver 120b according to an embodiment of the inventive concept. FIG. 18A shows the symmetric ODT circuit including the supply voltage VDD ODT between the transmitter 110b and the receiver 120b, and FIG. 18B shows a symmetric ODT circuit including the ground voltage VSS ODT. FIG. 19A is a diagram illustrating an operation of first and second sign inversion parts 1810 and 1820 of FIG. 18A. FIG. 19B is a diagram illustrating symbols of a codeword applied to the power voltage VDD ODT target between the transmitter 110b and the receiver 120b.

Referring to FIG. 18A, the transmitter 110b may further include the first sign inversion part 1810 coupled to the encoding circuit 900 in the PAM-4 encoder 112, and, the receiver 120b may further include the second code inversion part 1820 coupled to the decoding circuit 1300 in the PAM-4 decoder 122, in comparison with the transmitter 110a of FIG. 16A. In addition, the receiver 120b may include a termination circuit 128b connected between the supply voltage VDD line and the channel 130 according to the operating performance of the receiver 120b. The termination circuit 128b may include a termination resistor R4 connected between the supply voltage VDD and the channel 130. The termination circuit 128b may include the asymmetric ODT connected to different voltages, that is, the supply voltage VDD, with respect to a codeword level including many symbol levels −3 corresponding to the ground voltage VSS level provided as the ground voltage VSS ODT target in the MTA table 302 of the encoding circuit 900.

The first and second sign inversion parts 1810 and 1820 may receive an ODT control signal MRS_ODT provided from the mode registers 115 of FIG. 11 and 125 of FIG. 14. The ODT control signal MRS_ODT is a signal indicating whether an ODT state between the transmitter 110*b* and the receiver 120*b* is the symmetric ODT state or the asymmetric ODT state.

In an initialization operation after the device 100 (FIG. 1) is powered up, the ODT state between the transmitter 110*b* and the receiver 120*b* may be checked. When the ODT state between the transmitter 110*b* and the receiver 120*b* is determined to be the same ground voltage VSS ODT state, that is, the symmetric ODT state, each of the mode register 115 of the transmitter 110*b* and the mode register 125 of the receiver 120*b* may store the ODT control signal MRS_ODT of a first logic level, for example, a logic low level. The ODT control signal MRS_ODT of the first logic level may be provided as a default ODT control signal. When the ODT state between the transmitter 110*b* and the receiver 120*b* is determined as the asymmetric ODT state, the mode registers 115 and 125 may store the ODT control signal MRS_ODT of a second logic level, for example, a logic high level.

In the symmetric ODT state including the ground voltage VSS ODT between the transmitter 110*b* and the receiver 120*b*, the first sign inversion part 1810 may transmit the codeword output from the encoding circuit 900 to the output buffer 116 in response to the ODT control signal MRS_ODT of the first logic level. The output buffer 116 may transmit a codeword having a current level corresponding to the symbol level −3, −1, +1, or +3 and a DC cost value described in FIG. 17 to the channel 130.

In the asymmetric ODT state including the supply voltage VDD ODT between the transmitter 110*b* and the receiver 120*b*, the first sign inversion part 1810 may invert an MSB bit among symbol bits of the codeword output from the encoding circuit 900 in response to the ODT control signal MRS_ODT of the second logic. As shown in FIG. 19A, the first sign inversion part 1810 inverts the MSB bit with respect to the symbol bit 00 of the symbol level −3 to convert it into the symbol bit 10 of the symbol level +3. The first sign inversion part 1810 may invert the MSB bit with respect to the symbol bit 01 of the symbol level −1 to convert the MSB bit into the symbol bit 11 of the symbol level +1. The first sign inversion part 1810 may invert the MSB bit with respect to the symbol bit 11 of the symbol level +1 to convert the MSB bit into the symbol bit 01 of the symbol level −1. The first sign inversion part 1810 may invert the MSB bit with respect to the symbol bit 10 of the symbol level +3 to convert the MSB bit into the symbol bit 00 of the symbol level −3.

In the asymmetric ODT state, the symbol levels −3, −1, +1, and +3 of the codeword output from the encoding circuit 900 may be respectively output as the symbol levels +3, +1, −1, and −3 of which signs of symbol level are inverted by the first sign inversion part 1810. The output buffer 116 of the transmitter 110*b*, the channel 130, and the termination circuit 128*b* of the receiver 120*b* may be modeled as shown in FIG. 19B, according to the symbol levels +3, +1, −1, and −3 inverted by the first sign inversion part 1810. Referring to FIG. 19B, for impedance matching of the channel 130, the termination resistor R4 may be set to the resistance value R equal to the resistance value R of the channel 130. Each of the pull-up transistor PU and the pull-down transistor PD of the output buffer 116 may differently represent a pull-up modeling resistance value R1 and a pull-down modeling resistance value R2 according to the symbol level −+3, +1, −1 or −3 of the codeword.

For example, with respect to the symbol level +3 inverted by the first sign inversion part 1810, the pull-up modeling resistance value R1 may be represented by the resistance value R and the pull-down modeling resistance value R2 may be represented by an infinity value. Accordingly, the symbol level +3 may have a zero (0) current level and a zero (0) DC cost value. With respect to the inverted symbol level +1, as the pull-up modeling resistance value R1 is represented by the resistance value 1.5R and the pull-down modeling resistance value R2 is represented by the resistance value 3R the symbol level +1 may have a 5VDD/18 current level and a DC cost value With respect to the inverted symbol level −1, as the pull-up modeling resistance value R1 is represented by the resistance value 3R and the pull-down modeling resistance value R2 is represented by the resistance value 1.5R, the symbol level −1 may have a 8VDD/18 current level and a DC cost value 8. With respect to the inverted symbol level −3, the pull-up modeling resistance value R1 may be represented by an infinity value and the pull-down modeling resistance value R2 may be represented by the resistance value R. Accordingly, the symbol level −3 may have a 9VDD/18 current level and a DC cost value of 9. In the supply voltage VDD ODT state, as the number of symbol levels +3 of the codeword increases, the codeword may be coded so as to be transmitted with low power.

In FIG. 18A, the second sign inversion part 1820 may provide the codeword received through the input buffer 126 to the decoding circuit 1300 in response to the ODT control signal MRS_ODT of the first logic level to be converted into a data burst.

The second sign inversion part 1820 may invert the MSB bit among the symbol bits of the codeword received through the input buffer 126 in response to the ODT control signal MRS_ODT of the second logic level. The second sign inversion part 1820 may invert the MSB symbol bit with respect to the MSB symbol bit inverted by the first sign inversion part 1810 to convert the MSB symbol bit into an original codeword output from the encoding circuit 900. The codeword converted into the original codeword by the second code inversion part 1820 may be provided to the decoding circuit 1300 to be recovered as the data burst.

For example, user data 00000011 may be configured such that a first data bit 0 is transmitted to the DBI signal line and encoded by the 7-8 bit encoding 200 of FIG. 2 performed by the PAM-4 encoder 112, and the remaining 7 bits 0000011 include the codeword having the symbol levels −3, −3, −3, and +1 using the MTA lookup table 302.

In the ground voltage VSS ODT state, that is, the symmetric ODT state, in which the ODT state between the transmitter 110*b* and the receiver 120*b* is the same, when the codeword having the symbol levels −3, −3, −3, and +1 is transmitted to the channel 130, the average DC cost value may be calculated as (0+0+0+8)/4=2. In the asymmetric ODT state in which the ground voltage VSS ODT state of the transmitter 110*b* and the supply voltage VDD ODT state of the receiver 120*b* are different from each other, the codeword having the symbol levels 3, +3, +3, and −1 inverted by the first sign inversion part 1810 is transmitted to the channel 130, the average DC cost value may be calculated as (0+0+0+8)/4=2. That is, when the codeword generated using the MTA lookup table 302 is transmitted to the channel 130 between the transmitter 110*b* and the receiver 120*b*, the average DC cost value is the same in the symmetric ODT state and the asymmetric ODT state.

As described with reference to FIGS. 18A, 19A and 19B, the codeword of the ground voltage VSS ODT target generated by the PAM-4 encoder 112 of the transmitter 110*b* may be configured to be converted into the codeword for the supply voltage VDD ODT of the channel 130 by the first sign inversion circuit 1810, and into the codeword of the original ground voltage VSS ODT target by the second sign inversion circuit 1820.

Referring to FIG. 18*b*, the MTA lookup table 302 in the transmitter 110*b* may include codeword symbols including many symbol levels +3 applied to the supply voltage VDD ODT target, and the termination circuit 128*b*' of the receiver 120*b* may be connected between the channel 130 and the ground voltage VSS line, in comparison with FIG. 18A. The asymmetric ODT state including the ground voltage VSS ODT may be between the transmitter 110*b* and the receiver 120*b*.

The first sign inversion part 1810 may invert the MSB bit among the symbol bits of the codeword output from the encoding circuit 900 in response to the ODT control signal MRS_ODT of the second logic level. Accordingly, the codeword of the supply voltage VDD ODT target provided from the MTA lookup table 302 may be converted into the codeword for the ground voltage VSS ODT of the channel 130 by the first sign inversion part 1810.

The second sign inversion part 1820 may invert the MSB bit among the symbol bits of the codeword for the ground voltage VSS ODT received through the input buffer 126 in response to the ODT control signal MRS_ODT of the second logic level. Accordingly, the received codeword for the ground voltage VSS ODT may be converted into the codeword of the original supply voltage VDD ODT target by the second sign inversion part 1820.

FIG. 20 is a block diagram of a first example of a memory system 1500 including an encoding and decoding apparatus according to an embodiment of the inventive concept.

Referring to FIG. 20, the memory system 1500 may include a memory controller 1510 and a memory device 1520. The memory system 1500 may refer to an integrated circuit, an electronic device or system, a smart phone, a tablet PC, a computer, a server, a workstation, a portable communication terminal, a personal digital assistant (PDA), a portable multimedia player (PMP), a computing device such as other suitable computers, virtual machine or a virtual computing device thereof, etc. Alternatively, the memory system 1500 may be a part of components included in a computing system such as a graphics card.

The memory controller 1510 may be communicatively connected to the memory device 1520 through a channel or a memory bus 1530. For the sake of brevity, it is illustrated that a clock CLK signal, a command/address CA signal, and data DQ are provided between the memory controller 1510 and the memory device 1520 through one signal line, but the clock CLK signal, the command/address CA signal, and the data DQ may be actually provided through a plurality of signal lines or a bus.

The clock CLK signal may be transmitted from the memory controller 1510 to the memory device 1520 through a clock signal line of the memory bus 1530. The command/address CA signal may be transmitted from the memory controller 1510 to the memory device 1520 through a command/address CA bus of the memory bus 1530. A chip selection CS signal may be transmitted from the memory controller 1510 to the memory device 1520 through a chip selection CS line of the memory bus 1530. The chip selection CS signal activated to a logic high may represent that the command/address CA signal transmitted through the command/address CA bus is a command. The data DQ may be transmitted from the memory controller 1510 or from the memory device 1520 or from the memory device 1520 to the memory controller 1510, through a data DQ bus of the memory bus 1530 including bidirectional signal lines.

The memory controller 1510 may include a data transmitter 1512 that transmits the data DQ to the memory device 1520. The data transmitter 1512 may include the PAM-4 encoder 112 configured to convert data bursts to be transmitted to the memory device 1520 into PAM-4 symbols. The data transmitter 1512 may include the PAM4 encoder 112 that converts data bursts to be transmitted through the data bus into codewords including a plurality of symbols. The PAM-4 encoder 112 may be configured to encode the data bursts into a codeword corresponding to the data bursts using MTA codeword mappings in which no MT event occurs between the plurality of symbols and MDC codeword mappings related to minimum power consumption of the plurality of symbols. The PAM-4 encoder 112 may provide the MTA codeword mappings in which no MT event occur in the block boundary BB between the codewords. In the symmetric ODT state in which the ODT state between the memory controller 1510 and the memory device 1520 connected to the data bus is the same, the PAM-4 encoder 112 may transmit a first codeword through the data bus, and, in the asymmetric ODT state in which the ODT state is different, may invert the MSB bit among symbol bits of the first codeword, and transmit a second codeword including the inverted MSB symbol bit through the data bus.

The memory device 1520 may write the data DQ or read the data DQ under the control of the memory controller 1510. The memory device 1520 may include a memory cell array 1522 and a data input buffer 1524.

The memory cell array 1522 may include a plurality of word lines and a plurality of bit lines, and a plurality of memory cells formed at intersections of the word lines and the bit lines. The memory cells of the memory cell array 1522 may include volatile memory cells (e.g., dynamic random access memory (DRAM) cells, static RAM (SRAM) cells, etc.), nonvolatile memory cells (e.g., flash memory cells, resistive RAM (ReRAM) cells, etc., phase change RAM (PRAM) cells, magnetic RAM (MRAM) cells, or other types of memory cells.

The memory device 1520 may be configured to receive and decode the PAM-4 symbols transmitted through the data DQ bus using the data input buffer 1524. The data input buffer 1524 may include the PAM-4 decoder 122 configured to recover the PAM-4 symbols into the write data bursts. The data input buffer 1524 may include the PAM-4 decoder 122 that receives codewords including a plurality of symbols through a data bus and recovers the received codewords into data bursts. The PAM-4 decoder 122 may be configured to decode codewords into data bursts corresponding to a codeword using MTA codeword mappings in which no MT event occurs between the plurality of symbols and MDC codeword mappings related to minimum power consumption of the plurality of symbols. In the symmetric ODT state in which the ODT state between the memory controller 1510 and the memory device 1520 connected to the data bus is the same, the PAM-4 decoder 122 may receive the first codeword and recover the first codeword as the data bursts, and, in the asymmetric ODT state in which the ODT state is different, may invert the MSB bit among symbol bits of the received first codeword, and recover the second codeword including the inverted MSB symbol bit as the data bursts. The data input buffer 1524 may provide the decoded write data bursts for writing to the memory cell array 1522.

Figure 21:
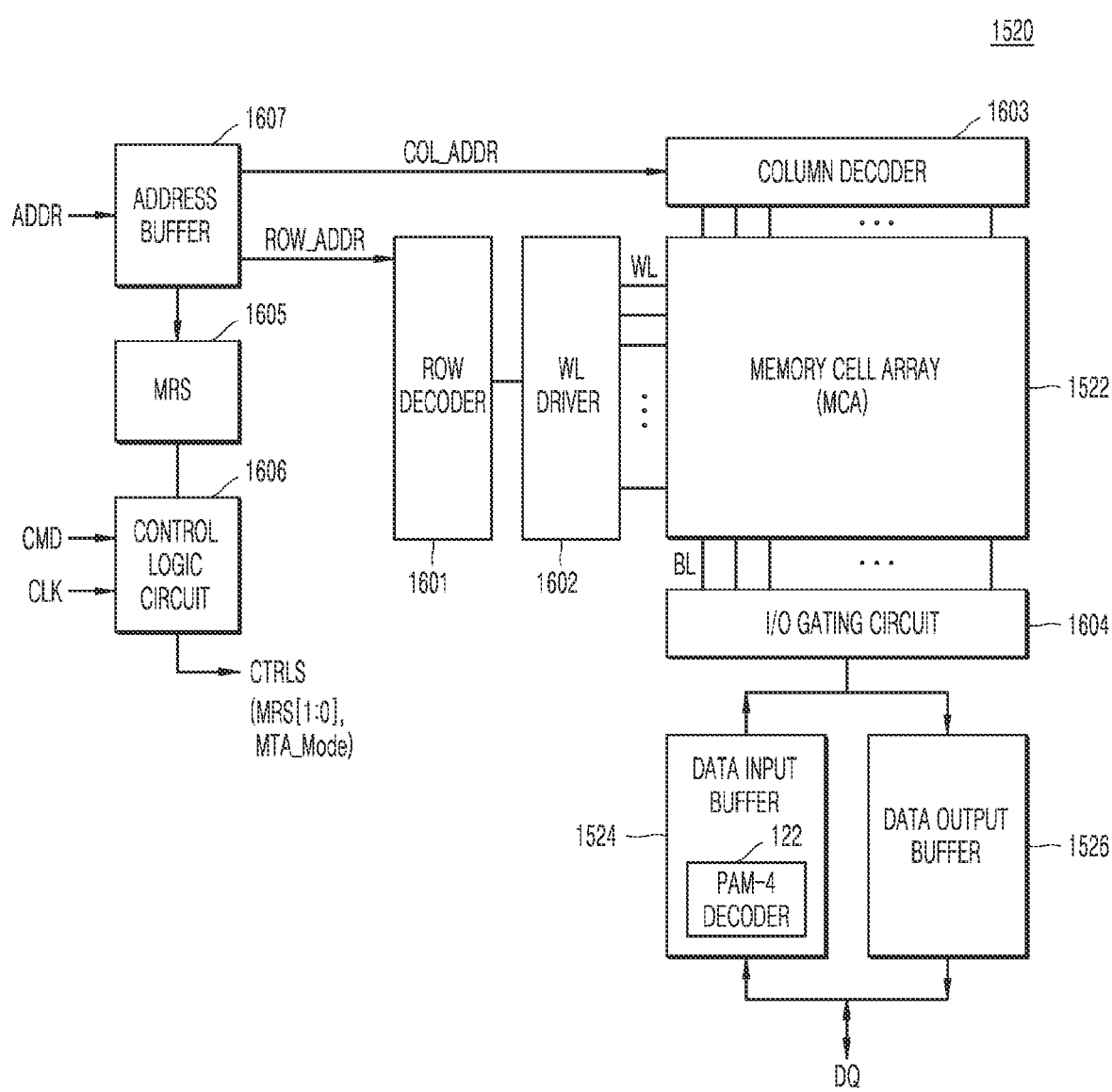
FIG. 21 is a block diagram of a part of the memory system of FIG. 20.

FIG. 21 is a block diagram illustrating a part of the memory device 1520 of FIG. 20.

Referring to FIG. 21, the memory device 1520 may include a memory cell array 1522, a row decoder 1601, a word line driver 1602, a column decoder 1603, an input/ output gating circuit 1604, an MRS 1605, a control logic circuit 1606, an address buffer 1607, a data input buffer 1524, and a data output buffer 1526.

The memory cell array 1522 includes a plurality of memory cells provided in the form of a matrix arranged in rows and columns. The memory cell array 1522 includes the plurality of word lines WL and the plurality of bit lines BL connected to the memory cells. The plurality of word lines WL may be connected to the rows of the memory cells, and the plurality of bit lines BL may be connected to the columns of the memory cells.

The row decoder 1601 may select any one of the plurality of word lines WL connected to the memory cell array 1522. The row decoder 1601 may decode a row address ROW_ADDR received from the address buffer 1607 to select any one word line WL corresponding to the row address ROW_ADDR, and connect the selected word line WL to the word line driver 1602 which is activated. The column decoder 1603 may select certain bit lines BL from among the plurality of bit lines BL of the memory cell array 1522. The column decoder 1603 may decode a column address COL_ADDR received from the address buffer 1607 to generate a column selection signal, and connect the bit lines BL selected by the column select signal to the input/output gating circuit 1604. The input/output gating circuit 1604 may include read data latches storing read data of the bit lines BL selected by the column selection signal, and a write driver writing write data to the memory cell array 1522. The read data stored in the read data latches of the input/output gating circuit 1604 may be provided to the data DQ bus through the data output buffer 1526. The write data may be applied to the memory cell array 1522 through the data input buffer 1524 connected to the data DQ bus and through the write driver of the input/output gating circuit 1604.

The control logic circuit 1606 may receive the clock signal CLK and the command CMD and generate control signals CTRLS for controlling an operation timing and/or a memory operation of the memory device 1520. The control logic circuit 1606 may read data from the memory cell array 1522 and write data to the memory cell array 1522 using the control signals CTRLS.

The MRS 1605 may store information used by the control logic circuit 1606 to configure the operation of the memory device 1520 to set operating conditions with respect to the memory device 1520. The MRS 1605 may include a register that stores parameter codes with respect to various operation and control parameters used to set the operating conditions of the memory device 1520. The parameter code may be received by the memory device 1520 through the command/address CA bus. The control logic circuit 1606 may provide the control signals CTRLS to circuits of the memory device 1520 to operate as set in the operation and control parameters stored by the MRS 1605. The control signals CTRLS may include the first mode selection signal MRS[1:0] and the second mode selection signal MTA_Mode described with reference to FIGS. 11, 14, and 18.

Figure 22:
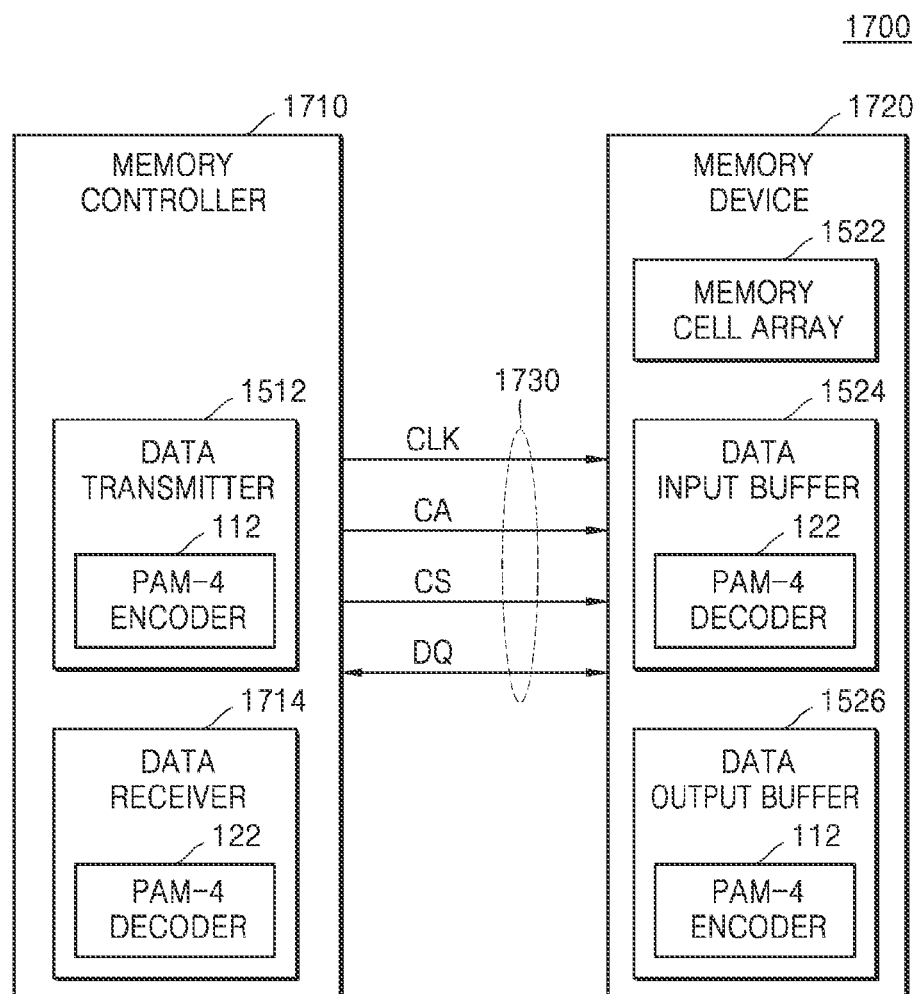
FIG. 22 is a block diagram of a second example of a memory system including an encoding and decoding apparatus according to an embodiment of the inventive concept.

FIG. 22 is a block diagram of an example of a memory system 1700 including an encoding and decoding apparatus according to an embodiment of the inventive concept.

Referring to FIG. 22, the memory system 1700 is different from the memory system 1500 of FIG. 20 in that the memory system 1700 further includes a data receiver 1714 including the PAM-4 decoder 122 in a memory controller 1710 and a memory device 1720 comprises the data output buffer 1526 including the PAM-4 encoder 112.

When transmitting read data bursts output from the memory cell array 1522 to the memory controller 1710, the memory device 1720 may be configured to encode and transmit PAM-4 symbols through the data output buffer 1526. The data output buffer 1526 may include the PAM-4 encoder 112 configured to convert read data into the PAM-4 symbols.

The memory controller 1710 may be configured to receive and decode the PAM-4 symbols transmitted through the data DQ bus through a data receiver 1714. The data receiver 1714 may include the PAM-4 decoder 122 configured to recover the PAM-4 symbols into the read data bursts.

Figure 23:
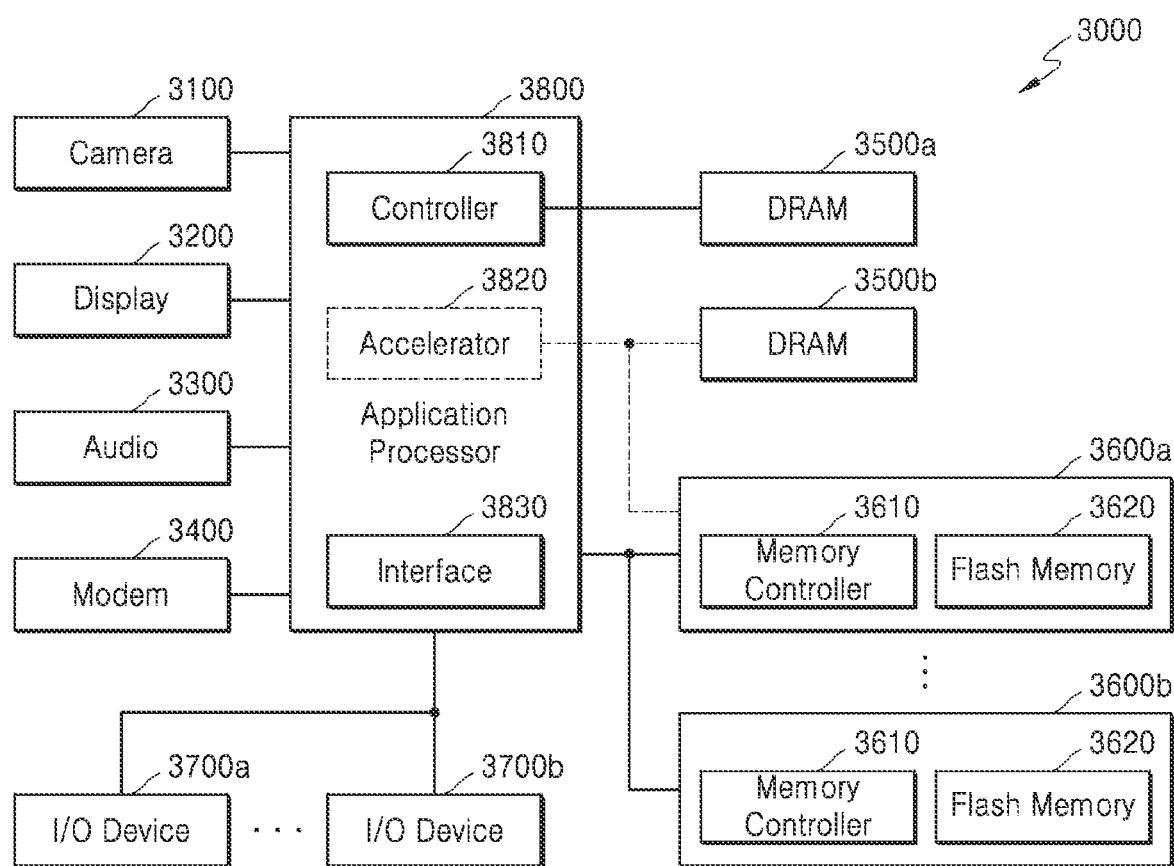
FIG. 23 is a block diagram of a first example of a system including an encoding and decoding apparatus according to an embodiment of the inventive concept.

FIG. 23 is a block diagram of an example of a system 3000 including an encoding and decoding apparatus according to an embodiment of the inventive concept.

Referring to FIG. 23, the system 3000 may include a camera 3100, a display 3200, an audio processor 3300, a modem 3400, DRAMs 3500a and 3500b, flash memories 3600a and 3600b, I/O devices 3700a and 3700b and an application processor (hereinafter referred to as "AP") 3800. The system 3000 may be implemented as a laptop computer, a mobile phone, a smart phone, a tablet personal computer, a wearable device, a healthcare device, or an Internet Of Things (IoT) device. In addition, the system 3000 may be implemented as a server or a personal computer.

The camera 3100 may capture a still image or a moving image according to control of a user, and may store the captured image/image data or transmit the captured image/image data to the display 3200. The audio processor 3300 may process audio data included in content of the flash memory devices 3600a and 3600b or a network. The modem 3400 may modulate and transmit a signal to transmit/receive wired/wireless data, and may demodulate the signal to recover the original signal at the receiving end. The I/O devices 3700a and 3700b may include devices providing a digital input and/or output function such as a universal serial bus (USB) or storage, a digital camera, a secure digital (SD) card, a digital versatile disc (DVD), a network adapter, and a touch screen, etc.

The AP 3800 may control the overall operation of the system 3000. The AP 3800 may control the display 3200 to display a part of the content stored in the flash memory devices 3600a and 3600b on the display 3200. When a user input is received through the I/O devices 3700a and 3700b, the AP 3800 may perform a control operation corresponding to the user input. The AP 3800 may include a controller 3810 and an interface 3830, and may include an accelerator block that is a dedicated circuit for an artificial intelligence (AI) data operation, or an accelerator chip 3820 separately from the AP 3800. The DRAM 3500b may be additionally mounted to the accelerator block or the accelerator chip 3820. An accelerator is a function block that performs a specific function of the AP 3800. The accelerator may include a graphics processing unit (GPU) that is a function block that specializes in graphic data processing, a neural processing unit (NPU) that is a block for performing an AI calculation and inference, and a data processing unit (DPU) that is a block that specializes in data transmission.

The system 3000 may include a plurality of DRAMs 3500a and 3500b. The AP 3800 may control the DRAMs 3500a and 3500b through a command and mode register (MRS) setting conforming to the Joint Electron Device Engineering Council (JEDEC) standard, or may communicate with the DRAMs 3500a and 3500b by a setting DRAM interface protocol to use a company-specific function such as low voltage/high speed/reliability and a cyclic redundancy check (CRC)/error correction code (ECC) function. For example, the AP 3800 may communicate with the DRAM 3500a through an interface conforming to JEDEC standards such as LPDDR4 and LPDDR5, and the accelerator block or accelerator chip 3820 may communicate with the DRAM 3500a by setting a new DRAM interface protocol to control the DRAM 3500b for accelerating to have a higher bandwidth than that of the DRAM 3500a.

While two DRAMs 3500a and 3500b are illustrated in FIG. 23, the inventive concept is not limited thereto. If the bandwidth, response speed, and voltage conditions of the AP 3800 or the accelerator chip 3820 are satisfied, any memory such as PRAM, SRAM, MRAM, RRAM, FRAM, or Hybrid RAM may be present. The DRAMs 3500a and 3500b have relatively smaller latency and bandwidth than the I/O devices 3700a and 3700b or the flash memories 3600a and 3600b. The DRAMs 3500a and 3500b may be initialized when the system 3000 is powered on, and may be used as temporary storage places for an operating system and application data when the operating system and application data are loaded thereon, or may be used as an execution space for various software codes.

In the DRAMs 3500a and 3500b, addition/subtraction/multiplication/division operations, vector operations, address operations, or fast Fourier transform (FFT) operations may be performed. In addition, a function used for inference may be performed in the DRAMs 3500a and 3500b. Here, the inference may be performed in a deep learning algorithm using an artificial neural network. The deep learning algorithm may include a training operation of training a model through various data and an inference operation of recognizing data with the trained model. In an embodiment, an image captured by the user through the camera 3100 is signal-processed and stored in the DRAM 3500b, and the accelerator block or accelerator chip 3820 may perform AI data operation of recognizing data using the data stored in the DRAM 3500b and the function used for inference.

The system 3000 may include a plurality of storage devices having a larger capacity than those of the DRAMs 3500a and 3500b or a plurality of flash memories 3600a and 3600b. The accelerator block or accelerator chip 3820 may perform the training operation and AI data operation by using the flash memory devices 3600a and 3600b. In an embodiment, the flash memories 3600a and 3600b may use an operation unit included in the memory controller 3610 to more efficiently perform the training operation and the inference AI data operation performed by the AP 3800 and/or the accelerator chip 3820. The flash memories 3600a and 3600b may store pictures taken through the camera 3100 or data transmitted through a data network. For example, the flash memories 3600a and 3600b may store augmented reality/virtual reality, high definition (HD), or ultra high definition (UHD) content.

The system 3000 may transmit or receive signals for high-speed operation between components. The camera 3100, the display 3200, the audio processor 3300, the modem 3400, the DRAMs 3500a and 3500b, the flash memories 3600a and 3600b, the I/O devices 3700a and 3700b and/or the AP 3800 in the system 3000 may include the transmitter 110 and the receiver 120 described with reference to FIGS. 1 to 19. The transmitter 110 includes an encoder that converts data bursts to be transmitted through a data bus into codewords including a plurality of symbols. The encoder is configured to encode the data bursts into a codeword corresponding to the data bursts using codeword mappings having a low minimum DC current (MDC) cost related to minimum power consumption of the plurality of symbols among maximum transition avoidance (MTA) codeword mappings in which no maximum transition (MT) event occurs between the plurality of symbols. The encoder may provide MTA codeword mappings where no MT event occurs in a block boundary between codewords. In a symmetric ODT state in which an ODT state between the transmitter 110 and the receiver 120 connected to the data bus is the same, the encoder may transmit a first codeword through the data bus, and, in an asymmetric ODT state in which the ODT state is different, may invert an MSB bit among symbol bits of the first codeword, and transmit a second codeword including the inverted MSB symbol bit through the data bus.

The receiver 120 includes a decoder that receives codewords including a plurality of symbols through a data bus, and recovers the received codewords into data bursts. The decoder may be configured to decode codewords into data bursts corresponding to a codeword using MTA codeword mappings in which no MT event occurs between the plurality of symbols and MDC codeword mappings related to minimum power consumption of the plurality of symbols. In the symmetric ODT state in which the ODT state between the transmitter 110 and the receiver 120 connected to the data bus is the same, the decoder may receive the first codeword and recover the first codeword as the data bursts, and, in the asymmetric ODT state in which the ODT state is different, may invert the MSB bit among symbol bits of the received first codeword, and recover the second codeword including the inverted MSB symbol bit as the data bursts.

While the inventive concept has been particularly shown and described with reference to embodiments thereof, it will be understood that various changes in form and details may be made therein without departing from the spirit and scope of the following claims.

What is claimed is:

1. An apparatus comprising:
   a receiver connected to a data bus,
   wherein the receiver comprises a decoder configured to receive codewords comprising a plurality of symbols through the data bus, and recover data bursts from the received codewords, and
   wherein the decoder is further configured to decode the codewords into the data bursts corresponding to the codewords using maximum transition avoidance (MTA) codeword mappings in which no maximum transition (MT) event occurs between the plurality of symbols in each codeword among a first subset of the codewords and minimum DC current (MDC) codeword mappings related to minimum power consumption in which the MT event occurs up to a maximum of two times between the plurality of symbols in each codeword among second other subset of the codewords,
   wherein the codewords are modulated using a pulse amplitude modulation (PAM) modulation scheme.

2. The apparatus of claim 1, wherein the decoder is further configured to invert a current codeword among the codewords and recover the inverted current codeword as the data bursts corresponding to the inverted codeword when a last symbol of a previous codeword among the codewords and a first symbol of the current codeword are received at a same highest symbol level in a block boundary between the codewords.

3. The apparatus of claim 1, wherein the decoder is further configured to invert a current codeword among the codewords and recover the inverted current codeword as the data bursts corresponding to the inverted codeword when least significant bits (LSBs) of a last symbol of a previous codeword among the codewords and a first symbol of the current codeword are equal to a certain value in a block boundary between the codewords.

4. The apparatus of claim 1, wherein the decoder is further configured to invert the codewords in response to an inversion signal received from outside the apparatus and recover the inverted codewords as the data bursts corresponding to the inverted codewords.

5. The apparatus of claim 1, wherein the decoder is further configured to receive a first codeword among the codewords and recover a data burst from the first codeword in a symmetric on-die-termination (ODT) state in which an ODT state of a transmitter connected to the data bus is the same as an ODT state of the receiver.

6. The apparatus of claim 5, wherein the decoder is configured to invert a most significant bit (MSB) among symbol bits of the first codeword and transmit a second codeword comprising the inverted MSB in an asymmetric on-die-termination (ODT) state in which the ODT state of the receiver is different from the ODT state of the transmitter.

7. An apparatus comprising:
a receiver connected to a data bus,
wherein the receiver comprises a decoder configured to receive codewords comprising a plurality of symbols through the data bus, and recover data bursts from the received codewords, and
wherein the decoder comprises a logic circuit representing correlations between the codewords and the data bursts, wherein the logic circuit comprises codeword mappings related to operation requirements of the decoder, wherein the operation requirements of the decoder comprise a maximum transition avoidance (MTA) requirement between the plurality of symbols and a minimum DC current (MDC) requirement related to minimum power consumption of the plurality of symbols; and
a decoding circuit configured to determine whether a current codeword among the codewords received by the decoder is an inverted codeword, and recover a data burst from the current codeword using lookup tables, wherein the codewords are modulated using a pulse amplitude modulation (PAM) modulation scheme.

8. The apparatus of claim 7, wherein the decoder is configured to perform 8:7 bit decoding to convert codeword symbols of 8-bits into half-data bursts of 7-bits, in conjunction with an encoder configured to provide a lookup table to split 16-bits of the data bursts into two 1 half-data bursts, send a 1-bit value in each of 8-bits of the half-data bursts to a data bus inversion (DBI) signal line to encode a pair of 1-bit values into a symbol of the DBI signal line, perform 7:8-bit encoding on remaining 7-bits of each of the half-data bursts, generate codewords comprising four symbols having at least four levels according to 7:8-bit encoding, and set a block boundary between the codewords with respect to the 1 half-data bursts.

9. The apparatus of claim 8, wherein the decoding circuit is further configured to recover the half-data bursts by combining the 7 bits recovered by the 8:7 bit decoding and the 1-bit value of the symbol received through the DBI signal line.

10. The apparatus of claim 8, wherein the logic circuit comprises:

a first lookup table supporting the MTA requirement;
a second lookup table supporting the MDC requirement; and
a third lookup table supporting both the MTA requirement and the MDC requirement,
wherein each of the symbols of the codeword has a −3 level, a −1 level, a +1 level or a +3 level, the +3 level being a highest voltage level and the −3 level being a lowest voltage level.

11. The apparatus of claim 10, wherein the third lookup table comprises the codeword mappings according to symbol encoding of the −3 level, −1 level or +1 level without the +3 level in the symbols of each codeword in the 8:7 bit decoding, wherein no maximum transition (MT) event from the level −3 to the level +3 or from the level +3 to the level −3 occurs between the symbols of each codeword.

12. The apparatus of claim 11, wherein the first lookup table comprises the codeword mappings in which no MT event occurs between the symbols of each codeword and no MT event occurs in a block boundary.

13. The apparatus of claim 11, wherein the second lookup table comprises the codeword mappings in which the MT event between the symbols is present two times or one time by allowing the MT event between the symbols of each codeword up to two times.

14. The apparatus of claim 11, wherein the logic circuit further comprises a fourth lookup table partially supporting the MTA requirement and the MDC requirement.

15. The apparatus of claim 14, wherein the fourth lookup table comprises the codeword mappings satisfying the MTA requirement in which no MT event occurs between the symbols of each codeword but allowing the MT event in the block boundary.

16. The apparatus of claim 14, wherein the fourth lookup table comprises the codeword mappings in which the MT event between the symbols is present one time or is not present by allowing the MT event between the symbols of each codeword up to one time.

17. The apparatus of claim 8, wherein the decoding circuit is further configured to invert a current codeword among the codewords when a last symbol of a previous codeword among the codewords received through the data bus and a first symbol of the current codeword in the block boundary are symbols having a highest symbol level.

18. The apparatus of claim 8, wherein the decoding circuit is further configured to invert a current codeword among the codewords and recover the data bursts corresponding to the inverted codeword when least significant bits (LSBs) of a last symbol of a previous codeword among the codewords and a first symbol of the current codeword are equal to a certain value in a block boundary between the codewords.

19. The apparatus of claim 7, wherein the decoder is further configured to receive a first codeword among the codewords and recover a data burst from the first codeword in a symmetric on-die-termination (ODT) state in which an ODT state of a transmitter connected to the data bus is the same as an ODT state of the receiver.

20. The apparatus of claim 19, wherein the decoder is configured to invert a most significant bit (MSB) among symbol bits of the first codeword and recover a data bust from a second codeword comprising the inverted MSB in an asymmetric on-die-termination (ODT) state in which the ODT state of the receiver is different from the ODT state of the transmitter.

* * * * *